United States Patent
Nguyen

(10) Patent No.: US 8,351,869 B2
(45) Date of Patent: Jan. 8, 2013

(54) ELECTRIC CIRCUIT TRACER

(75) Inventor: Tich Nguyen, San Diego, CA (US)

(73) Assignee: IDEAL Industries, Inc., Sycamore, IL (US)

( * ) Notice: Subject to any disclaimer, the term of this patent is extended or adjusted under 35 U.S.C. 154(b) by 1955 days.

(21) Appl. No.: 11/232,678

(22) Filed: Sep. 22, 2005

(65) Prior Publication Data

US 2007/0063688 A1    Mar. 22, 2007

(51) Int. Cl.
H04B 1/38    (2006.01)

(52) U.S. Cl. ............... 455/90.3; 455/90.1; 455/575.1

(58) Field of Classification Search ........... 455/90.1, 455/90.3, 550.1, 575.1
See application file for complete search history.

(56) References Cited

U.S. PATENT DOCUMENTS

| | | |
|---|---|---|
| 3,893,028 A | 7/1975 | Febvre et al. |
| 3,982,181 A | 9/1976 | Ferony et al. |
| 4,114,092 A | 9/1978 | Fry, Jr. |
| 4,686,454 A | 8/1987 | Pecukonis |
| 4,734,638 A | 3/1988 | Weber |
| 4,801,868 A | 1/1989 | Brooks |
| 4,804,907 A | 2/1989 | Pecukonis |
| 4,866,388 A | 9/1989 | Cosman et al. |
| 4,912,662 A | 3/1990 | Butler et al. |
| 4,969,647 A | 11/1990 | Mical et al. |
| 4,998,059 A | 3/1991 | Nigon et al. |
| 5,001,430 A | 3/1991 | Peterman et al. |
| 5,189,408 A | 2/1993 | Teicher |
| 5,361,029 A | 11/1994 | Rider et al. |
| 5,497,094 A * | 3/1996 | George ............... 324/529 |
| 5,519,329 A * | 5/1996 | Satterwhite ............ 324/690 |
| 5,686,831 A | 11/1997 | Vandervalk |
| 6,115,025 A | 9/2000 | Buxton et al. |
| 6,163,144 A | 12/2000 | Steber et al. |
| 6,538,636 B1 | 3/2003 | Harrison |
| 6,734,682 B2 | 5/2004 | Tallman et al. |
| 7,085,590 B2 * | 8/2006 | Kennedy et al. ......... 455/556.1 |
| 2003/0162151 A1 * | 8/2003 | Berling et al. ............. 434/5 |
| 2003/0201974 A1 * | 10/2003 | Yin ................ 345/158 |
| 2004/0008018 A1 | 1/2004 | Miller et al. |
| 2004/0179096 A1 * | 9/2004 | Harless et al. ............ 348/77 |
| 2004/0204059 A1 * | 10/2004 | Wong et al. ............ 455/556.1 |

* cited by examiner

Primary Examiner — Nhan Le
(74) Attorney, Agent, or Firm — Cook Alex Ltd.

(57) ABSTRACT

A circuit tracer includes a transmitter that places one of first and second signals on an electrical circuit depending on whether the circuit is energized. A receiver detects the signals imposed on the circuit by the transmitter, with the signal strength indicating the proximity of the receiver to the circuit. The receiver detects which of the transmitter signals is present and thereby can also indicate whether power is present on the circuit. The receiver has first and second antennas, one optimized for wide area detection and one optimized for circuit breaker detection. The receiver has an OLED display that remains properly oriented for viewing regardless of the orientation of the receiver housing. The transmitter can have a clamp version that inductively couples to the circuit being traced.

8 Claims, 24 Drawing Sheets

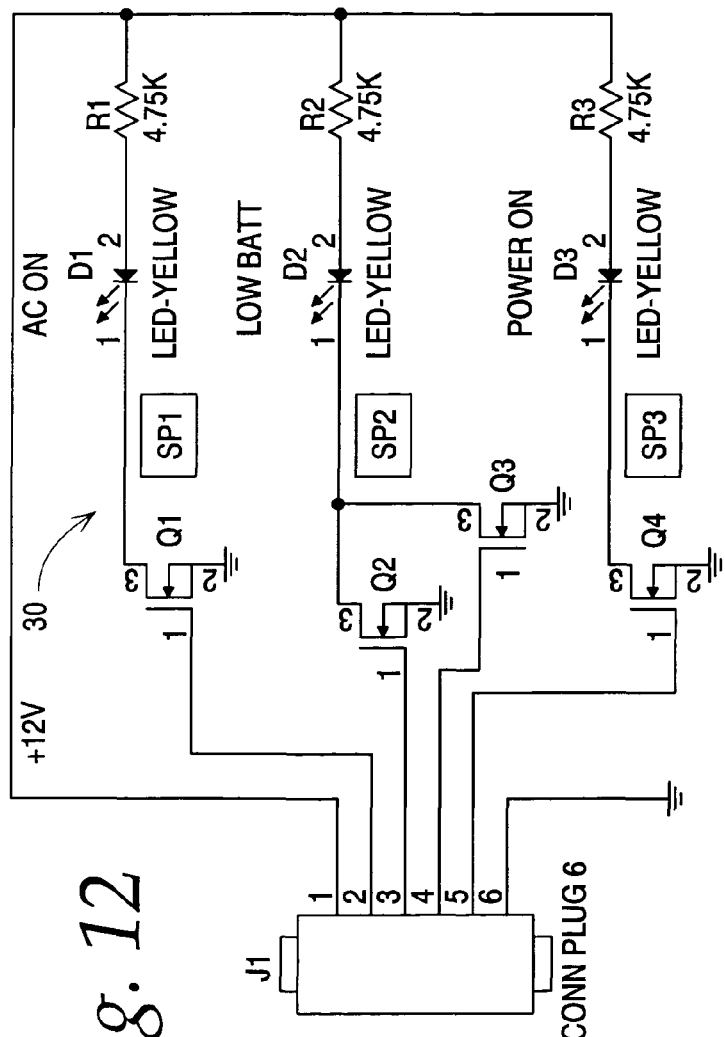
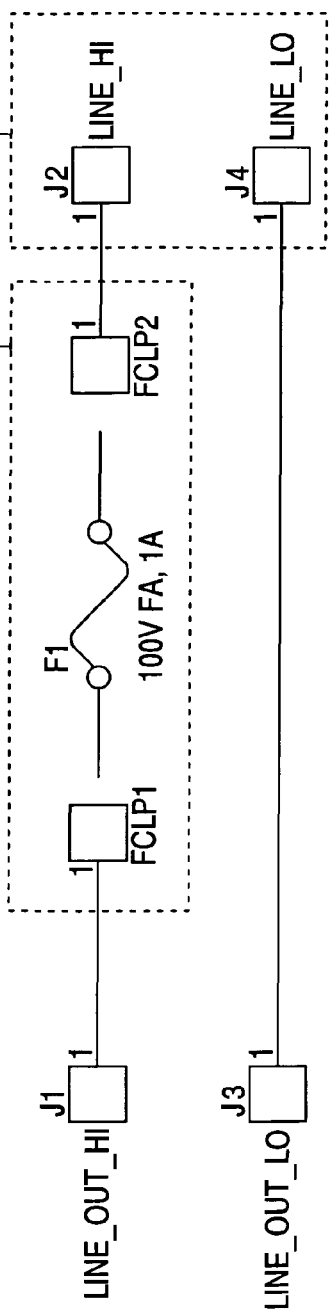

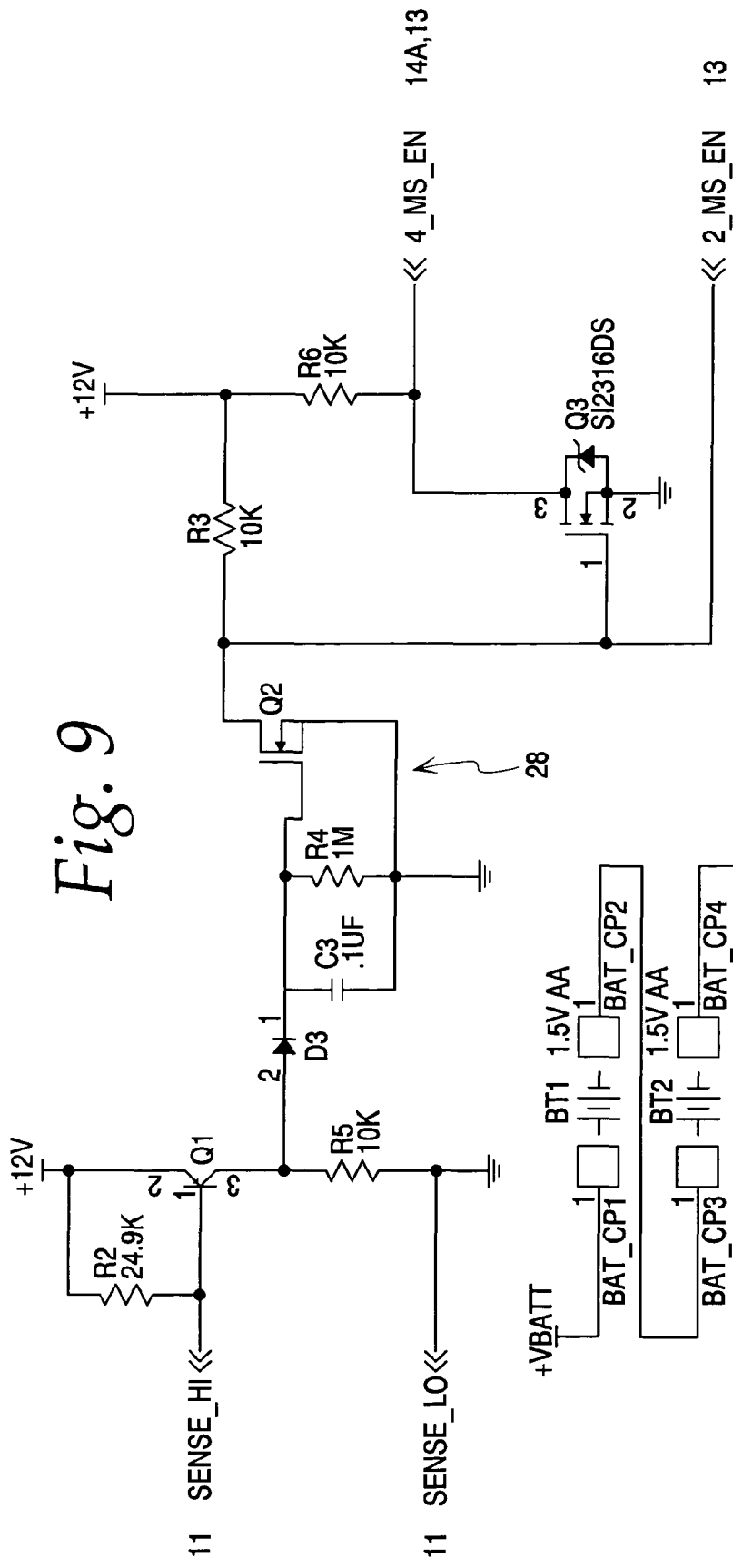

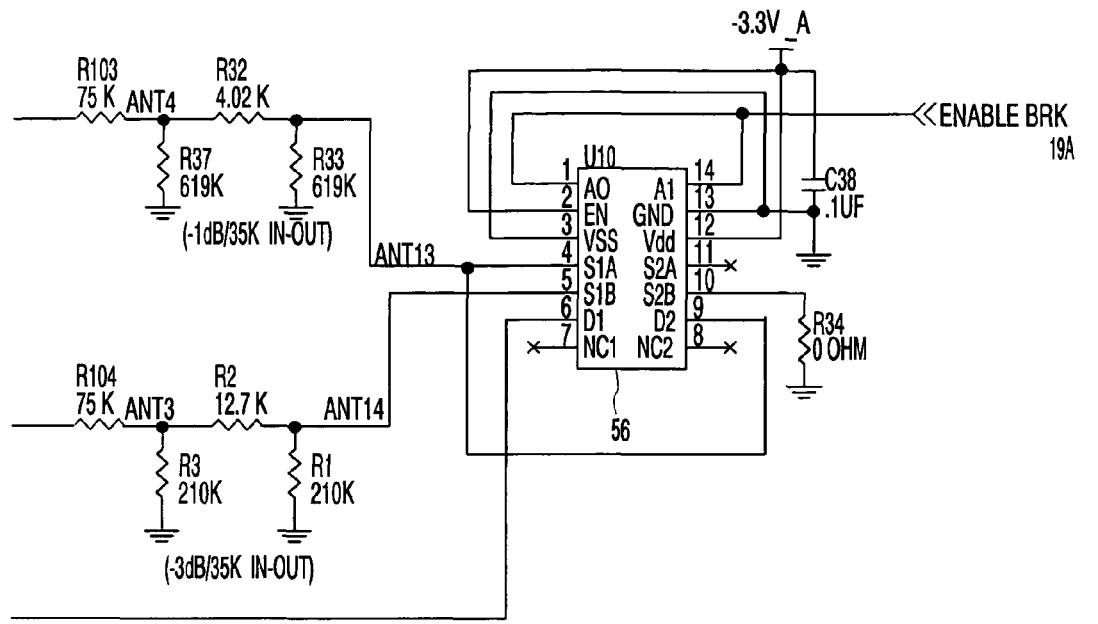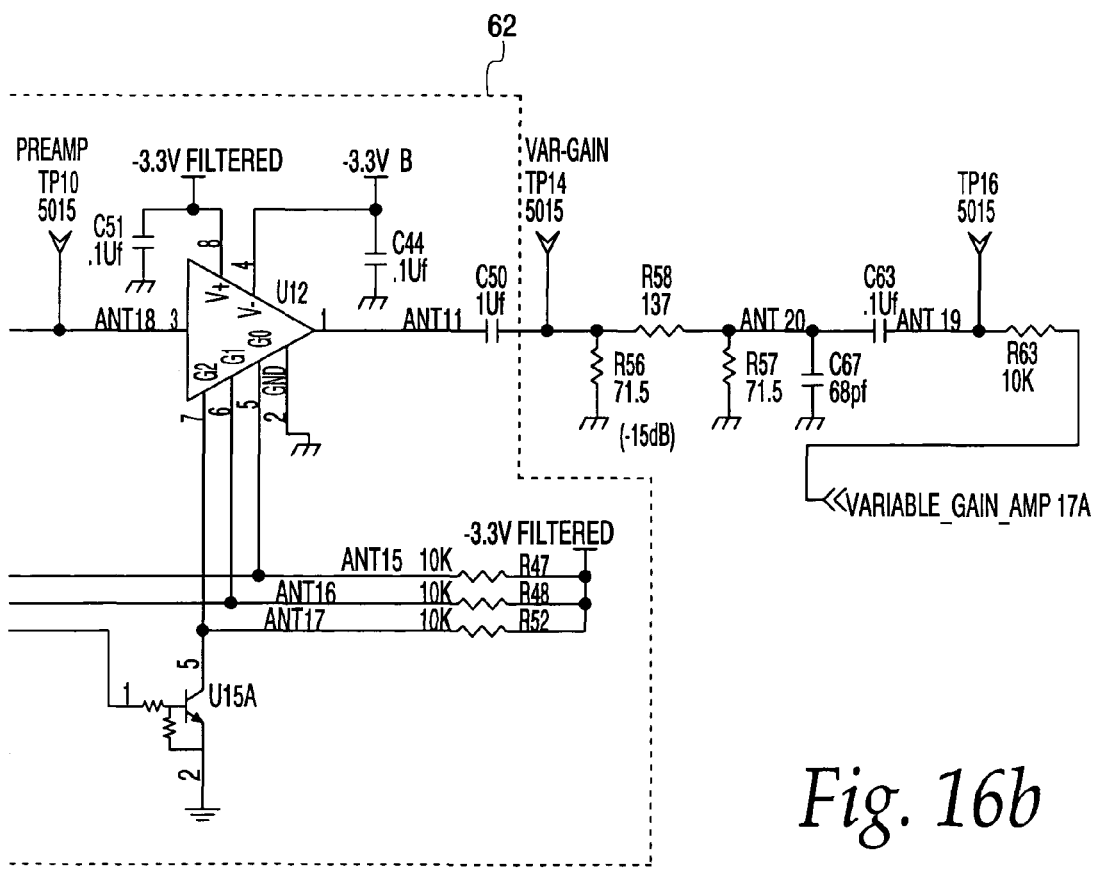
Fig. 16b

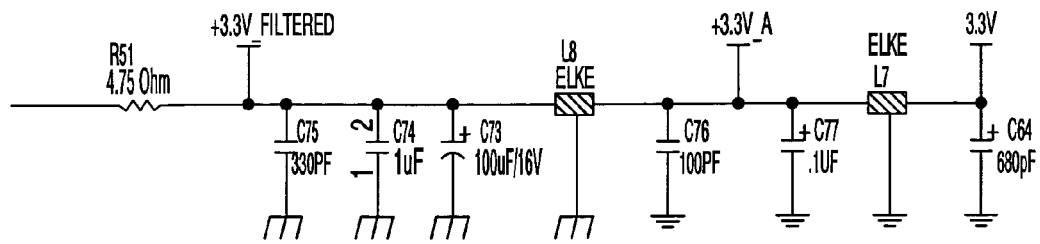
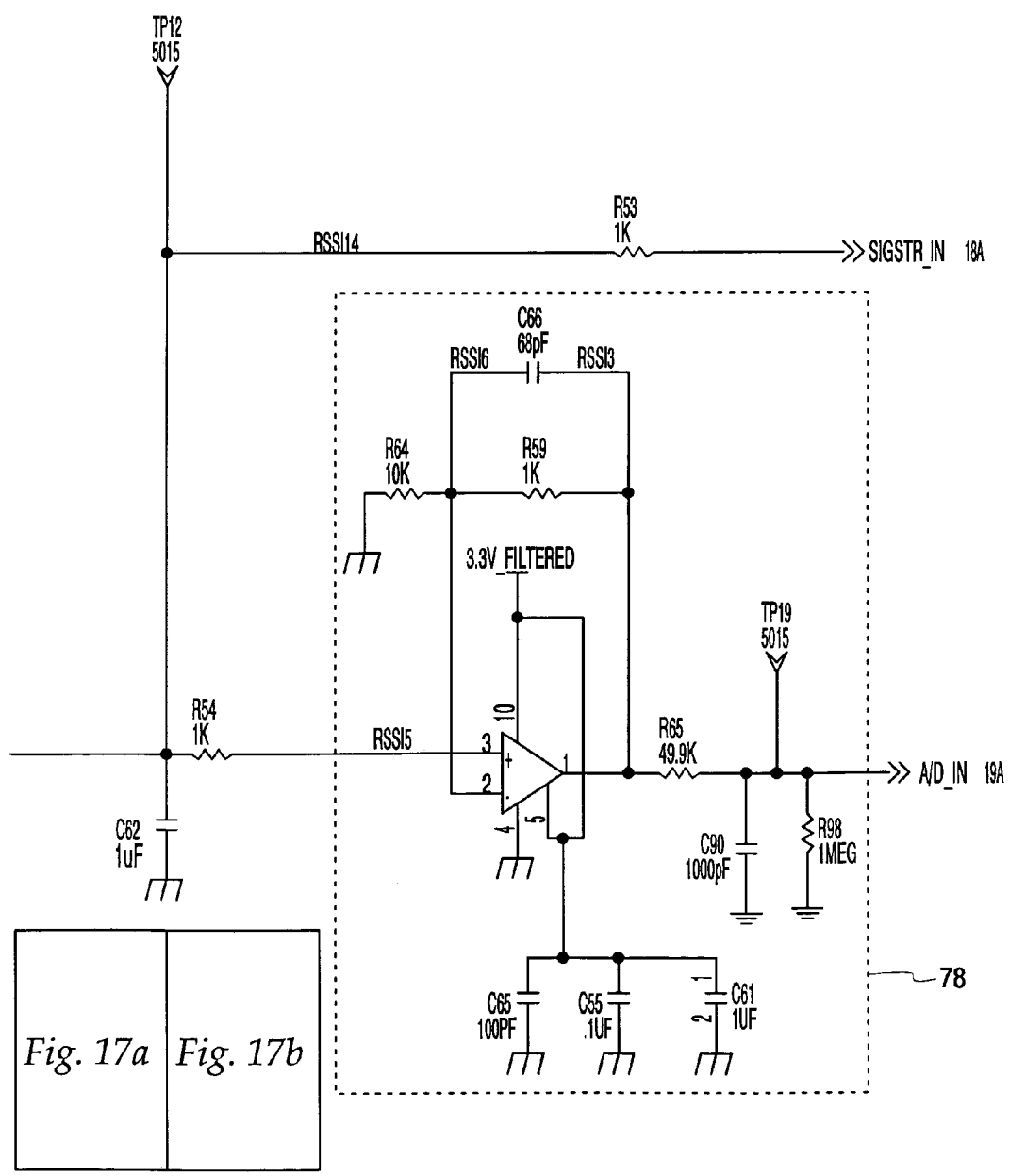
Fig. 17b
Fig. 17a | Fig. 17b

| Fig. 18a | Fig. 18b |

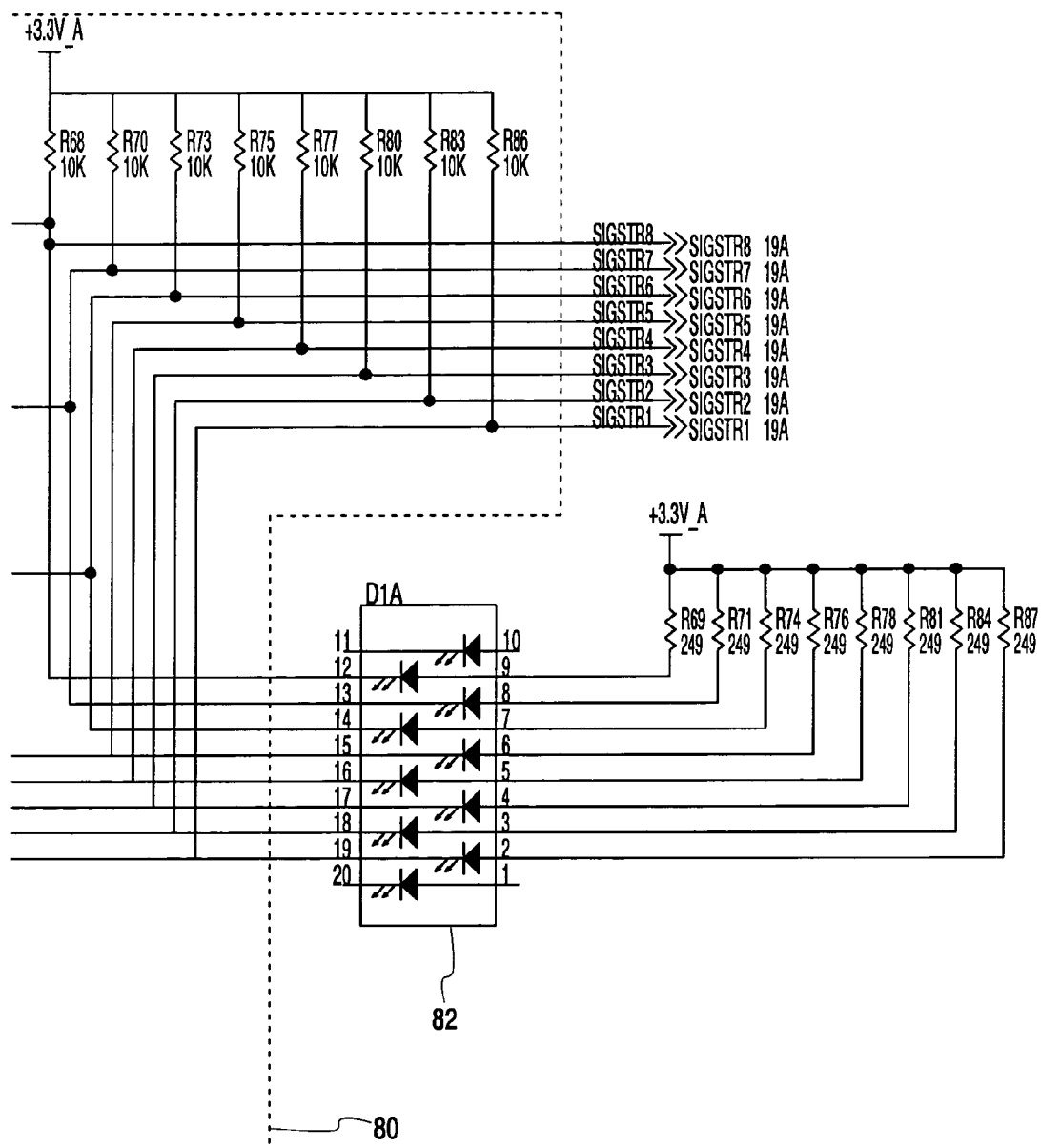
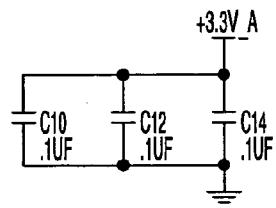
Fig. 18b

ELECTRIC CIRCUIT TRACER

BACKGROUND OF THE INVENTION

This invention relates generally to the monitoring, servicing, and maintaining of electric circuits comprising connections made with wires and more specifically to a system for tracing electric circuits using a transmitter and a receiver.

Circuit tracers are typically used to locate the wires of electric circuits when the wires are not easily accessible. Such uses include identifying circuit breakers, fuses, blown fuses, junction boxes, shorts to ground, and breaks in wires, to name a few. The electric circuits with which circuit tracers are used usually comprise insulated wires joining one connection point to another connection point over some distance. A connection point may be, for example, a junction box, switch, power outlet, circuit breaker, fuse, or other such connection point, to name a few. During operation of the circuit tracer, the transmitter is turned on and electrically coupled to a connection point of the electric circuit. For example, to determine which circuit breaker is associated with a particular outlet, the transmitter is connected to the power outlet in question. This may be done by connecting probes directly to the outlet and then turning on the transmitter to input a signal on the electric circuit. The user then utilizes the receiver to search for the signal at the circuit breaker location. The receiver indicates reception and strength of the transmitted signal in some manner, and then by indicating the strength of the received signal, the user can determine the precise location of the circuit by finding the location with the strongest signal. This is useful in construction situations where the wires connecting the circuit breaker and power outlet are inaccessible.

A circuit tracer typically includes a transmitter and a receiver. The transmitter may include a power supply such as a battery, a circuit for generating a signal to be detected, and connector for applying said signal on to the electric circuit.

Two common methods exist to couple the transmitter to the electric circuit. First, a direct physical connection can be made to the electrical circuit such as through the use of conductive clips, leads, probes, or other such devices. Second, an indirect connection can be made by inductively coupling a signal to the electrical circuit. This method is preferable when the wire connecting the electric circuit is insulated and no direct electrical connection can be achieved without damaging the insulation. Inductive transmission operates by using the principles of electromagnetic mutual inductance, which state that any change of magnetic flux (current) in one conductor will induce a voltage in another conductor. Thus, this principle is used to impose a signal onto a wire by subjecting the wire to a magnetic field set up by an alternating current (AC) signal transmitter circuit. Typically, the AC circuit in the transmitter is connected to ferrous material in the shape of a generally circular clamp. The spring-loaded clamp opens so that it may be placed in a position where it surrounds the wire. As the signal transmitter circuit outputs the signal to the clamp connected to it, a like signal is induced on the wire, which is surrounded by the clamp.

Various types of configurations exist for the transmitter units with inductive clamps. For example, the inductive clamp unit may be permanently fixed to the transmitter. Alternatively, the clamp unit may be connected to the transmitter through a cable. Some transmitters may also include provisions for direct connections in addition to an inductive method using a clamp. Further, power for both the clamp and transmitter may be supplied in any number of ways such as internal battery power or external battery power.

The receiver also exists in a variety of configurations. The antenna or detection portion of the receiver unit may be permanently fixed to the receiver, or it may be connected remotely through a cable. The means of communicating with the user may utilize any number of technologies, alone or in combination with one another. For example, the receiver may incorporate an audio alert indicating to the user that the electric circuit has been detected. Alternatively, the receiver may use a visual display to indicate a certain response to the transmitter signal. Furthermore, a receiver may use a combination of methods to communicate to the user. As with the transmitter, the receiver may be powered any number of ways including external sources or internal batteries to name a few.

Because the signal strength measurement is an important element of the circuit tracer in determining the location of the circuit, detection circuitry is critical. Complicating the detection method is the fact that the receiver needs to be sensitive enough to be able to detect the low power signal over a wide area yet not overload the receiver with a strong signal when in close proximity to the wire being traced.

Another difficulty with typical receivers is the visual display. During use of the receiver, a user may typically hold the receiver unit with the display at a variety of different orientations while tracing wires. The problem with the display is that at some orientations of the receiver, such as 180 degrees from normal, it becomes difficult to read. Depending on the location of the wires being traced, the user may not be able to hold the unit at an acceptable orientation due to physical limitations, so the display becomes difficult to read.

Physical location may also a problem for the transmitter unit. In small physical locations where a minimum of space exists and the inductive clamp is needed, the transmitter unit can become cumbersome. Because the clamp must be connected either as part of the unit or through a cable, it uses up valuable space or otherwise hinders the user from placing the transmitter at the needed location.

Since circuit tracers are often used to identify a circuit breaker needed to disconnect power from a circuit, the transmitter is often connected to power outlet terminals. However, after a circuit breaker has been opened to remove power on the circuit, the conventional circuit tracer receiver provides no indication to the user if power has indeed been disconnected on the desired circuit. For a variety of reasons, the wrong circuit breaker is sometimes opened, and users assume they have opened the correct one without verifying if there is power on the circuit. Thus, a safety hazard may be created through the use of circuit tracers because they do not confirm that power has been removed from a selected circuit.

SUMMARY OF THE INVENTION

In general, the circuit tracer disclosed herein utilizes a transmitter and a receiver. The transmitter is electrically connected to the circuit by suitable connections such as probes, prongs, alligator clips or the like. The transmitter addresses safety concerns by sending different signals depending on whether the circuit is live or not. The receiver can detect the different transmitter signals and tell the user whether a circuit is live. When the transmitter is first turned on it checks for AC or DC power in the circuit. If power is present, the transmitter will output a 32 KHz signal, 10 milliseconds long, repeated every 125 milliseconds. If power is not present, the 32 KHz signal will be applied for 20 milliseconds. Thus, by detecting which of these signals is sent the receiver will display to the user the power state, present or absent, on the electrical circuit. Also, the transmitter will turn on an LED indicating the presence of AC or DC power alerting a user at the transmitter that power is present.

To receive the transmitted signal, the receiver uses an improved receiving technique. This receiving technique involves using multiple antennas to receive the signal. Each antenna has a different gain, and the user selects the appropriate antenna gain combination via the receiver keypad to best trace a circuit's location.

After the receiver circuit processes the signal, the signal strength is output to the user through a display. According to one embodiment of the invention, this information is displayed in the form of a seven-segment display.

According to another embodiment, the signal strength information is displayed on a graphical organic light emitting diode (OLED) display. The OLED display unit will also detect when the receiver is tilted or upside down and rotate the image as needed so that the user can still readily see the image.

The present invention further includes an optional clamp unit. The clamp unit is used where the transmitter cannot make a direct connection to the circuit. If an indirect connection is required, then the clamp must be used. The clamp operates independently of the transmitter. Prior art circuit tracers required the clamp to connect to the transmitter unit in order to function. The clamp in this invention provides its own power source and incorporates its own transmitter circuitry. This allows the unit to operate independently in confined spaces. When the clamp is activated, it transmits a 32 KHz pulsed signal for 10 milliseconds repeated every 125 milliseconds. The transmitted signal is inductively coupled to the conductor or wire that is surrounded by the clamp. Power for the clamp is provided by an internal battery pack.

BRIEF DESCRIPTION OF THE DRAWINGS

FIG. 7 is a circuit diagram of the transmitter power I/O board, showing an AC outlet and a fused connection.

FIG. 9 is a circuit diagram of a portion of the transmitter battery board, showing an AC power detection circuit. In this and other circuit diagrams, lines connecting to points on other Figures are indicated with the connecting Figure number, as is conventional.

FIG. 10 is a circuit diagram of the transmitter battery pack.

FIG. 12 is a circuit diagram of the transmitter display board.

FIGS. 16a and 16b combine to form a circuit diagram of the antenna and pre-amp sections of the receiver circuit. The two Figures combine as illustrated to form a single circuit; they are divided onto separate sheets only due to size limitations. The Figures may be referred to collectively as FIG. 16.

DETAILED DESCRIPTION OF THE INVENTION

Figure 1:
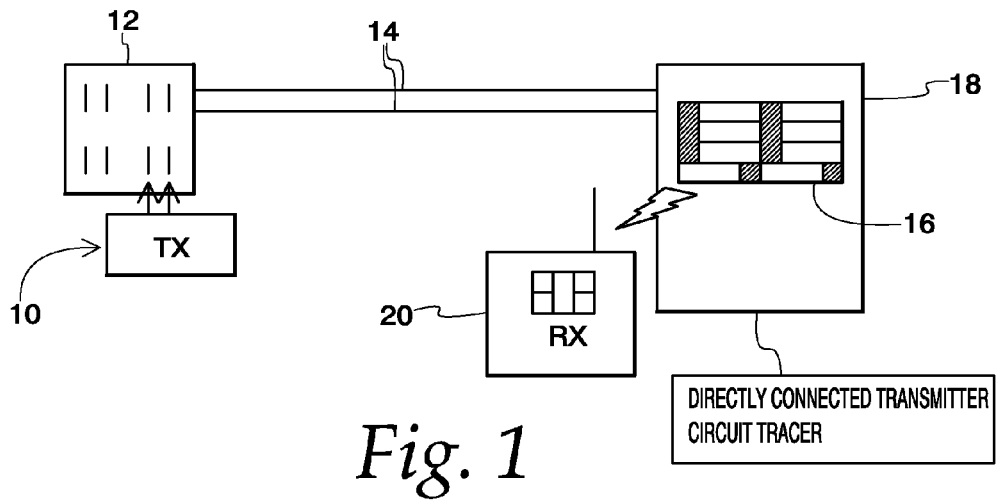
FIG. 1 is a schematic diagram of a circuit tracer directly connected to an electric circuit comprising a power outlet and a circuit breaker.

FIG. 1 is a schematic diagram illustrating a typical use of the transmitter unit. The transmitter 10 is directly connected to a power outlet 12. In this example, each outlet 12 is connected by wires 14 to one of the separate circuit breakers illustrated at 16 in a load center 18. The transmitter 10 will first determine whether AC power is present or not at the outlet 12. If power is present, a light emitting diode (LED) will light on the transmitter alerting the user to the presence of power. In addition, the transmitter will then select the appropriate signal to input on the electrical circuit. A 10 ms pulsed signal will be generated if power is present, and a 20 ms pulsed signal will be generated if power is not present. At the receiver 20, the display will indicate the signal strength of the received signal. By holding the receiver at the location of the strongest signal, the user, in this example, will be able to determine which circuit breaker is connected to the circuit in question. Alternately, if the user is trying to determine the location of the wires 14, say as they traverse walls, floors or a ceiling, the user moves the receiver from the outlet 12 along the wall, floor or ceiling and adjusts the position of the receiver to maintain the strongest signal as indicated on the display of the receiver or by an audible beeping tone from the receiver.

Figure 2:
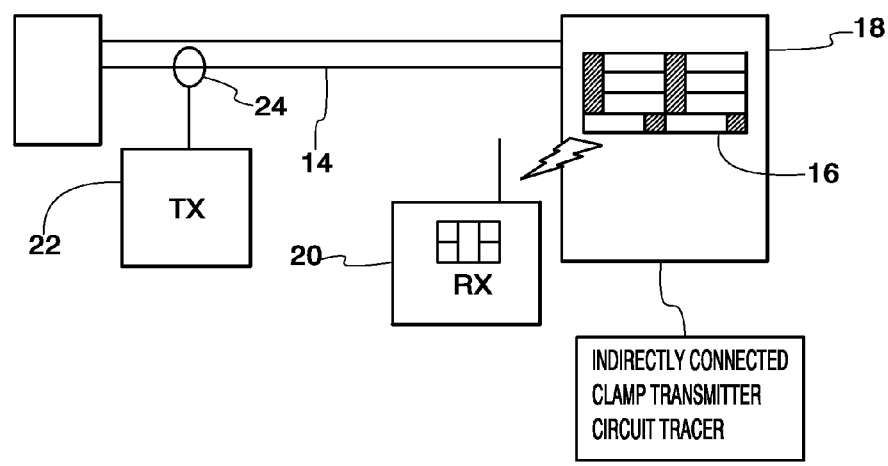
FIG. 2 is a schematic diagram of an alternate embodiment of the circuit tracer that has transmitter with a clamp for indirectly connecting to an electric circuit.

FIG. 2 is a schematic diagram illustrating an alternate embodiment of the transmitter. The alternate transmitter 22 incorporates a clamp 24. In this diagram, the clamp is placed around the wire 14 in question, and the receiver 20 is directed to the circuit breaker 16 associated with the strongest received signal or to the location of the wire where the strongest received signal is found.

Figure 3:
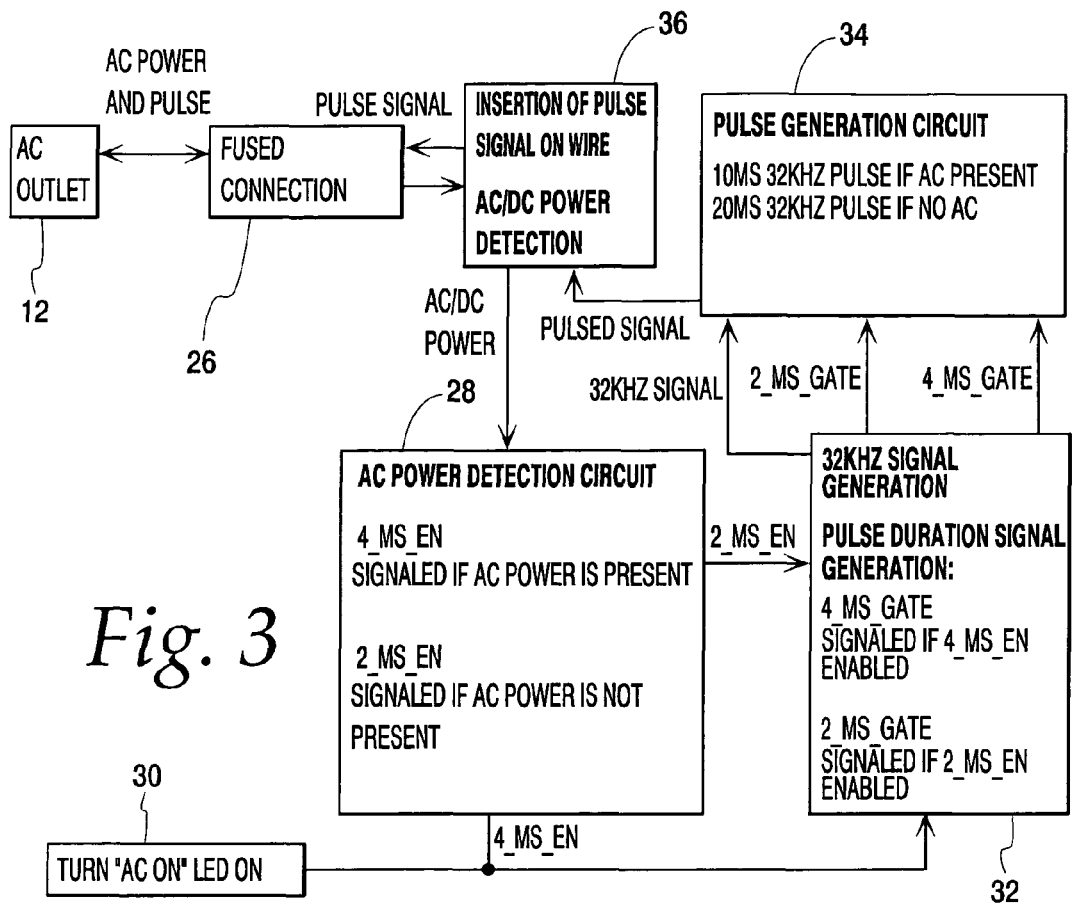
FIG. 3 is a block diagram of the transmitter unit with a direct interface.

FIG. 3 is a block diagram illustrating the operation of the transmitter 10. Details of the illustrated blocks will be described below. The transmitter includes a fused connection 26 that is suitably coupled to the AC outlet 12. The connection may be made by blades or probes inserted into a standard outlet, by alligator clips attached to an exposed point of the electrical circuit, or the like. The fused connection 26 feeds AC power detection circuits 36 and 28. These circuits determine whether electric power is present on the wires 14. If power is present signal 4_MS_EN is enabled, otherwise signal 2_MS_EN is enabled. Signal 4_MS_EN is fed to a power indicator circuit 30 and to a trace signal generation circuit 32. The power indicator circuit 30 is located on the transmitter to give the user a visual indication whether or not power is present. Signal 2_MS_EN is also fed to the trace signal generation circuit 32.

The trace signal generation circuit 32 involves two separate aspects. First, it has a 32 KHz signal generator. Second, it has a pulse gating circuit. The latter generates a 10 millisecond gating signal called 4_MS_GATE if power is present or generates 20 millisecond gating signal called 2_MS_GATE if power is not present on the circuit. These gating signals and the 32 KHz signal are fed into to the pulse generation circuit 34 which combines these signals to outputs a 10-millisecond signal if power is present or a 20-millisecond signal is power is not present. The 32 KHz gated signal output from 34 is supplied to a transmission circuit 36 for transformer coupling onto the AC outlet 12 through the fused connection 26.

A detailed description of the transmitter circuitry will now be provided. Referring to FIG. 7, the interface to the AC outlet 12 and the fused connection 26 are illustrated. J2 and J4 are connected into the outlet 12 while J1 and J3 connect to the rest of the transmitter circuit via wires. Fuse F1 protects against power surges or other such failure.

Figure 8:
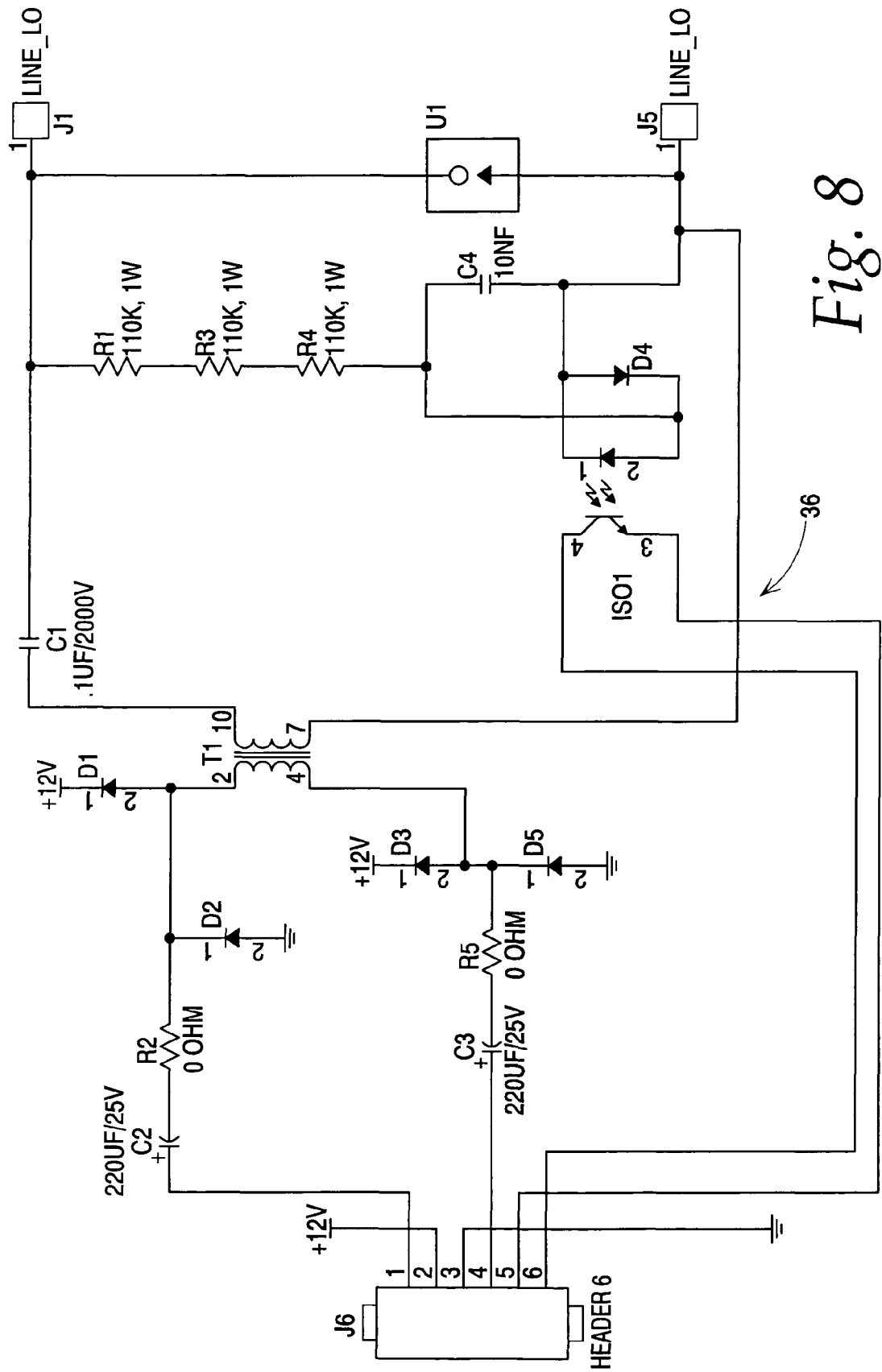
FIG. 8 is a circuit diagram of the transmitter main board, showing an AC power detection circuit and a transmission circuit for inserting a pulse signal on the electric circuit.

Connections J1 and J3 from FIG. 7 connect to the transmitter main board on FIG. 8 at J1 and J5 respectively. FIG. 8 shows the transmission circuit 36. U1 is a spark gap and provides lightning protection to both the transmitter and the power line. When a sufficient current value is reached, the spark gap closes creating a short circuit that blows fuse F1 in FIG. 7. Further details of the transmission circuit 36 will be described below.

The AC power detection circuit 28 comprises components in FIGS. 8, 9 and 10. As mentioned above, J1 and J5 of FIG. 8 are connected to the power outlet 12 through the fused connection 26. If there is power, then the power will activate an optical-electrical isolator ISO1. R1, R3, and R4 limit current from the outlet to the rectifier D4. C4 provides direct current (DC) blocking. The isolator is connected to pins 5 and 6 on J6, header 6. These pins connect to lines labeled Sense_Hi and Sense_Lo on the left side of FIG. 9, via pins 5 and 6 of J1, header 6 in FIG. 11.

When the isolator ISO1 is activated by AC power, the circuit on FIG. 9 comprising Q1, Q2, Q3, R2, R5, R4, R3, R6, D3, and C3 provides a signal with a value on 4_MS_EN. 4_MS_EN connects to J1 pin 2 in FIG. 12. Referring to FIG. 12, J1 pin 2 allows Q1 of the "AC ON" circuit 30 comprised of Q1, D1, and R1 to light the LED D1. R1 limits the current through the LED, D1. This LED is viewed by the user.

If no power is present on the power lines, then the AC power detection circuit 28 (comprising Q1, Q2, Q3, R2, R5, R4, R3, R6, D3, and C3) in FIG. 9 provides a signal with a value on 2_MS_EN.

Figure 13:
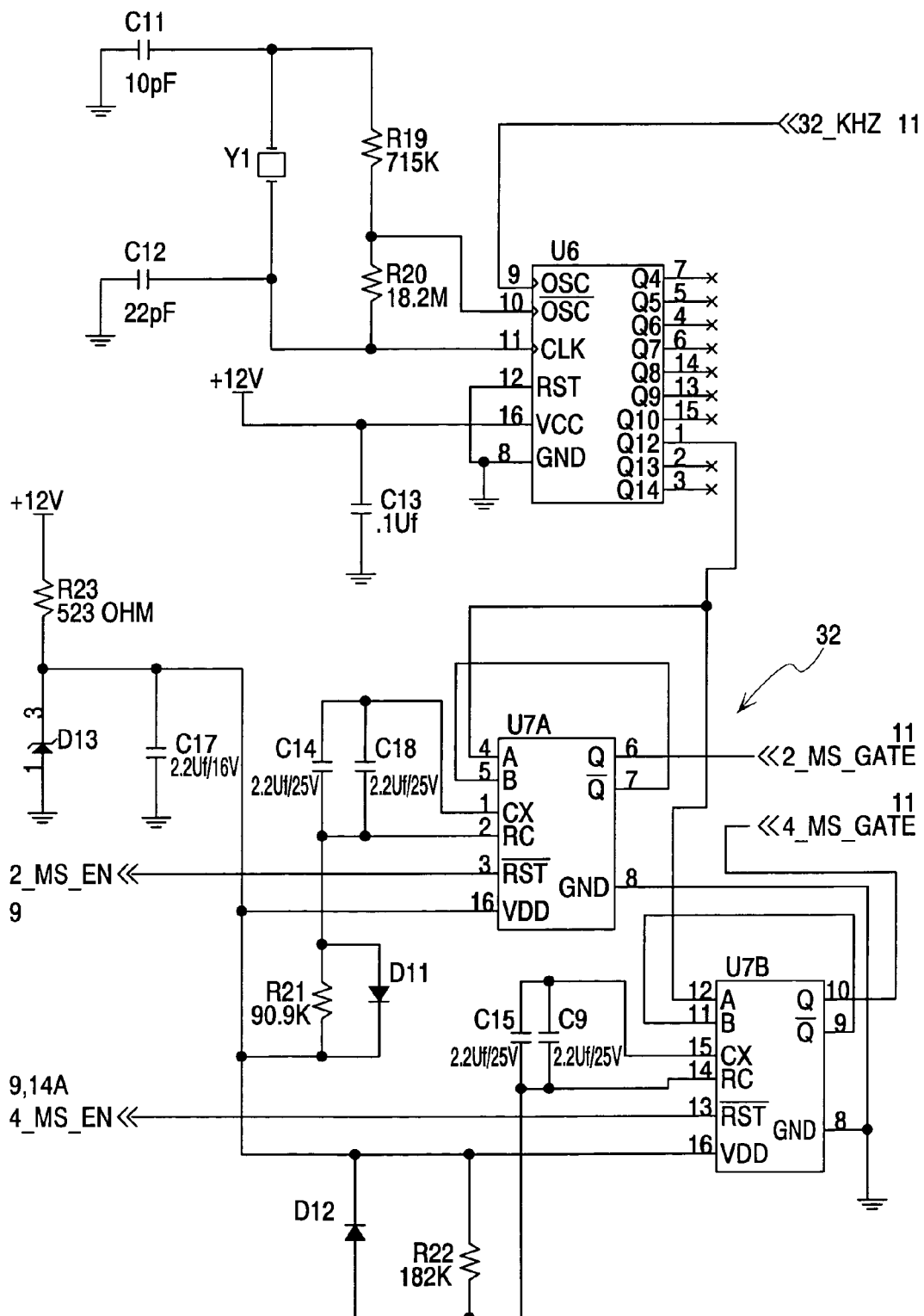
FIG. 13 is a circuit diagram of another portion of the transmitter battery board, showing the 32 KHz signal generator.

Both 2_MS_EN and 4_MS_EN connect to FIG. 13 comprising the 32 KHz signal generation and pulse generations circuits 32. Referring to FIG. 13, if no AC power is present, then the signal 2_MS_EN enables the circuit comprising U7A, C14, C18, R21, and D11 to determine a 20 millisecond pulse duration. If AC power is present, then the signal 4_MS_EN enables the circuit comprised of U7B, C15, C19, R22, and D12 to determine a 10 millisecond pulse duration. U7A and U7B are monostable multivibrators or "one-shot" devices. The circuit comprising C14, C18, R21, and D11 for U7A sets the time delay. The circuit comprising C15, C19, R22, and D12 controls the time delay for U7B. The 12V power for U7A and U7B is regulated through R23, D13, and filtered by C17. The circuit comprising C11, C12, Y1, R19, R20, and U6 continuously generates the 32 KHz signal. U6 outputs the 32 KHz signal to the one-shot devices and to the inverter in FIG. 11. The one-shots then output the 32 KHz signal for the proper duration (10 milliseconds or 20 milliseconds) depending on the presence or absence of AC power on the line being traced. The signal on 2_MS_EN produces a pulsed gate signal on 2_MS_GATE, and the signal on 4_MS_EN produces a pulsed gate signal on 4_MS_GATE. The 12V power for U6 is filtered by C13.

Figure 11:
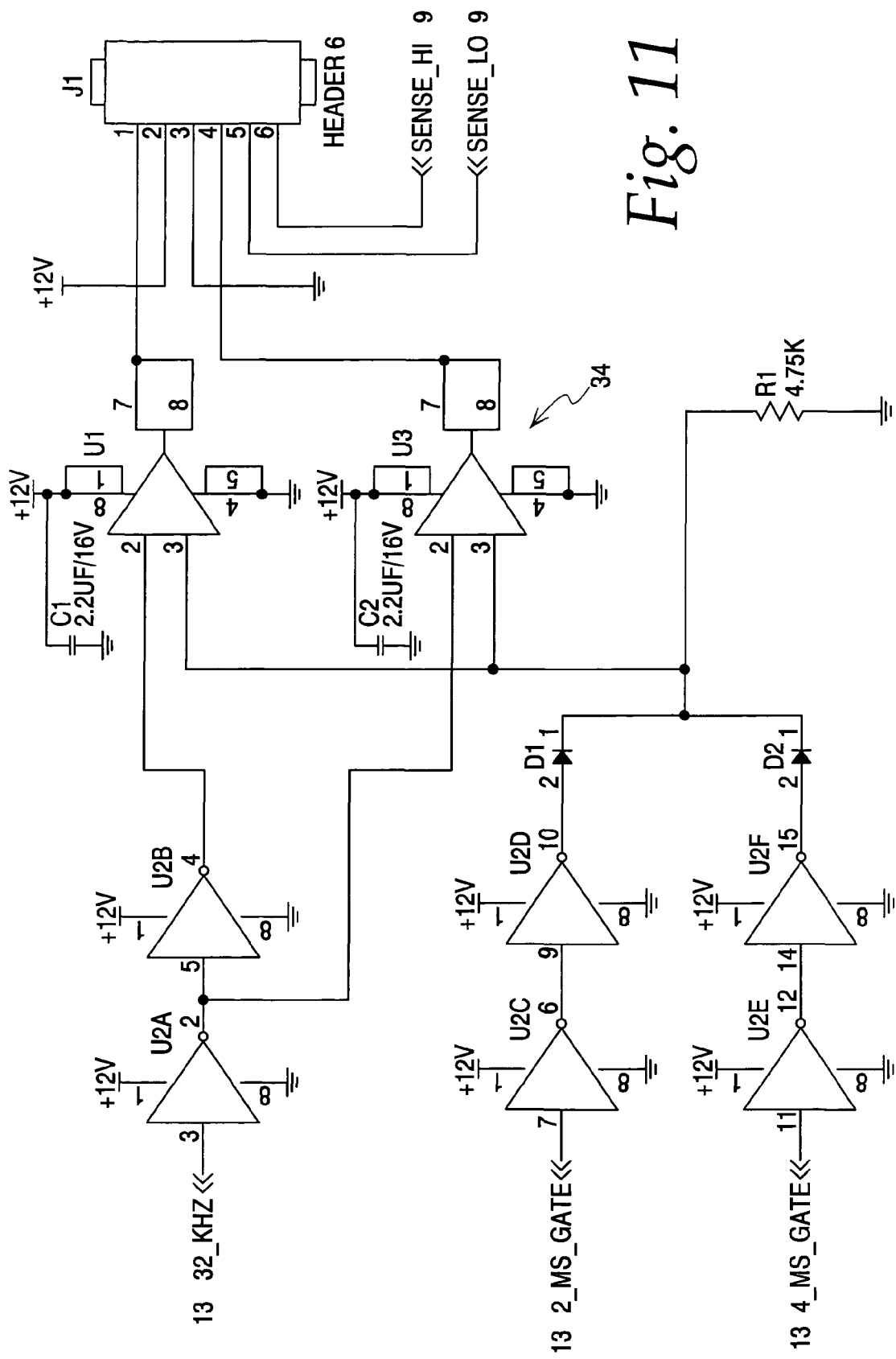
FIG. 11 is a circuit diagram of another portion of the transmitter battery board, showing the pulse generation circuit.

FIG. 11 contains the buffer circuitry comprising U2C, U2D, U2E, U2F, D1, D2, and R1. U2D and U2F provide the appropriate gate signal to U1 and U3. U2A and U2B invert the 32 KHz signal from U6 in FIG. 13 so that it will be present during the entire AC cycle. U1 and U3 operate as buffers which output the pulsed 32 KHz signal to the transmission circuit 36. Power to U1 is filtered by C1, and power to U3 is filtered by C2. The pulsed 32 KHz signal is transmitted on pins 1 and 4 of J1 header 6, which connect to pins 1 and 4 of J6 header 6 in FIG. 8.

From pins 1 and 4 of J6 header 6 in FIG. 8, the pulsed signal is input on the AC wires by the transformer, T1, which inductively couples the signal to the wires. C1, C2, and C3 are blocking capacitors. D1, D2, D3, and D5 operate as a rectifier. From the transformer, T1, the pulsed signal travels through J1 and J5 to J1 and J3 of FIG. 7 which connect to J2 and J4. J2 and J4 are connected to the outlet 12.

Figure 4:
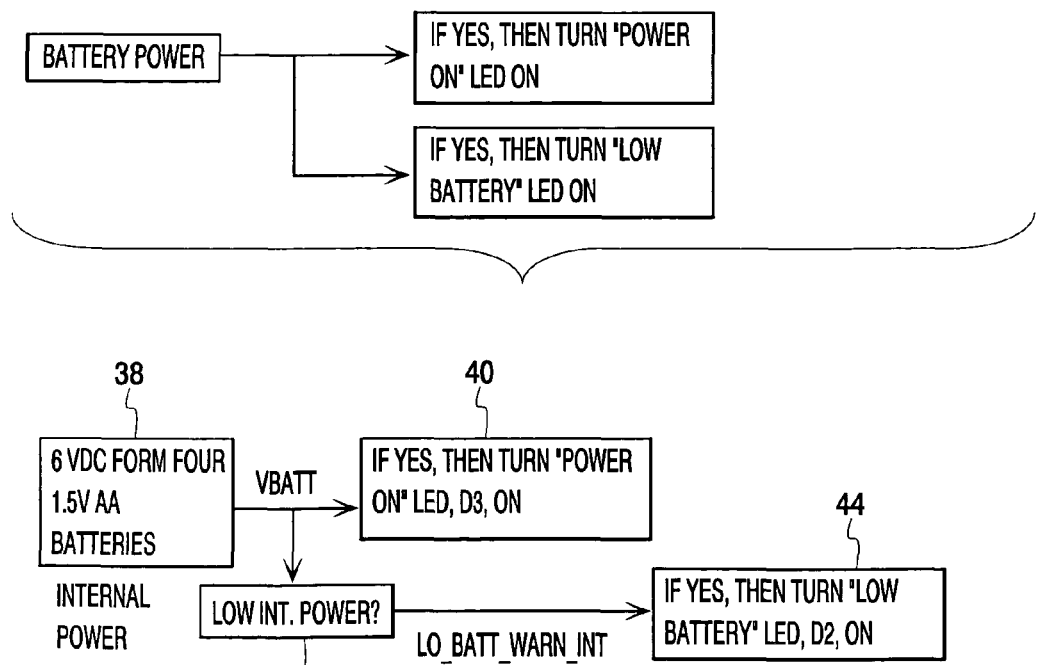
FIG. 4 is a block diagram illustrating operation of the power circuit for the transmitter of FIG. 1.
Figure 14A:
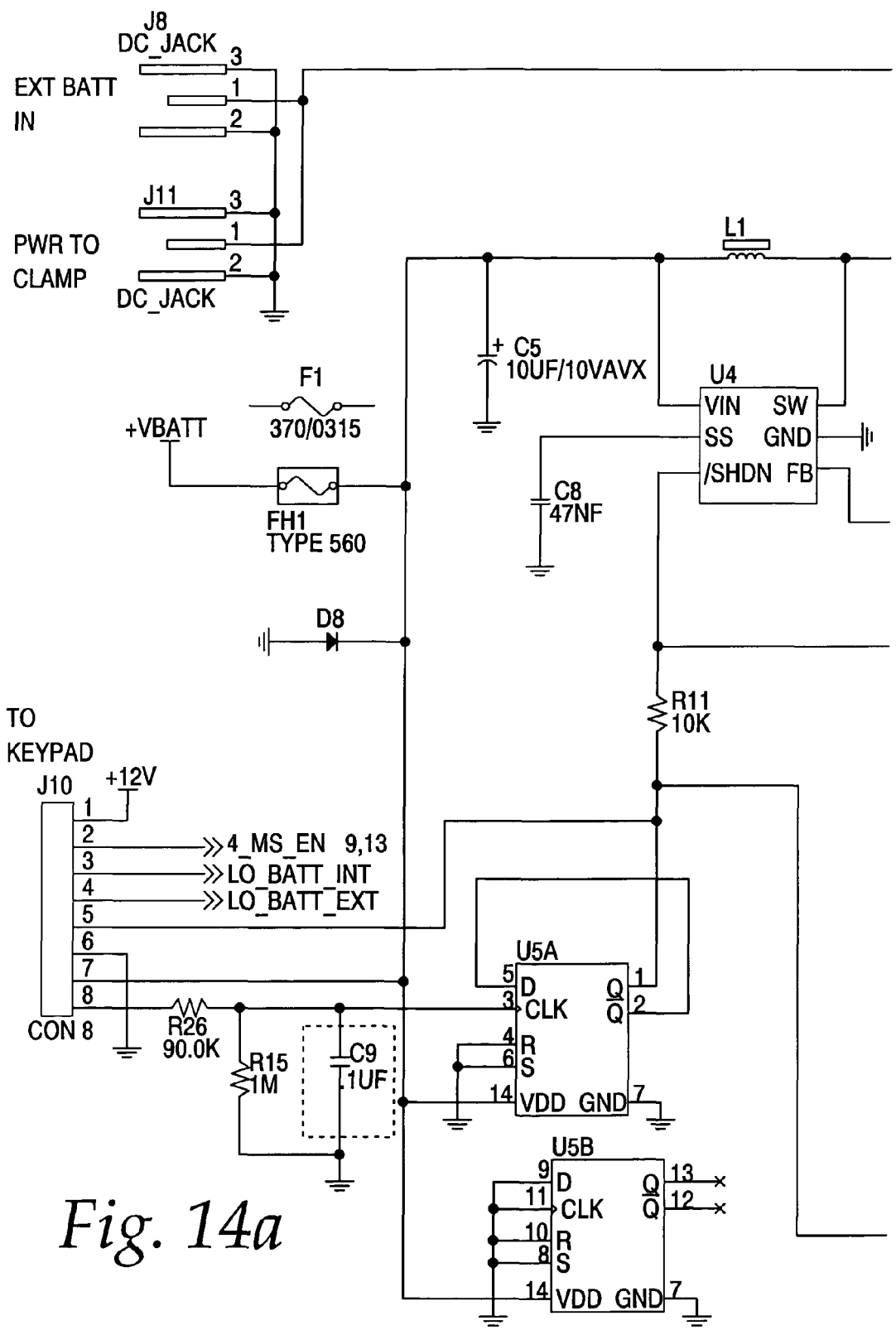
FIGS. 14a and 14b combine to form a circuit diagram of another portion of the transmitter battery board. The two Figures combine as illustrated in the upper right corner of FIG. 14b to form a single circuit; they are divided onto separate sheets only due to size limitations. The Figures may be referred to collectively as FIG. 14.
Figure 14B:
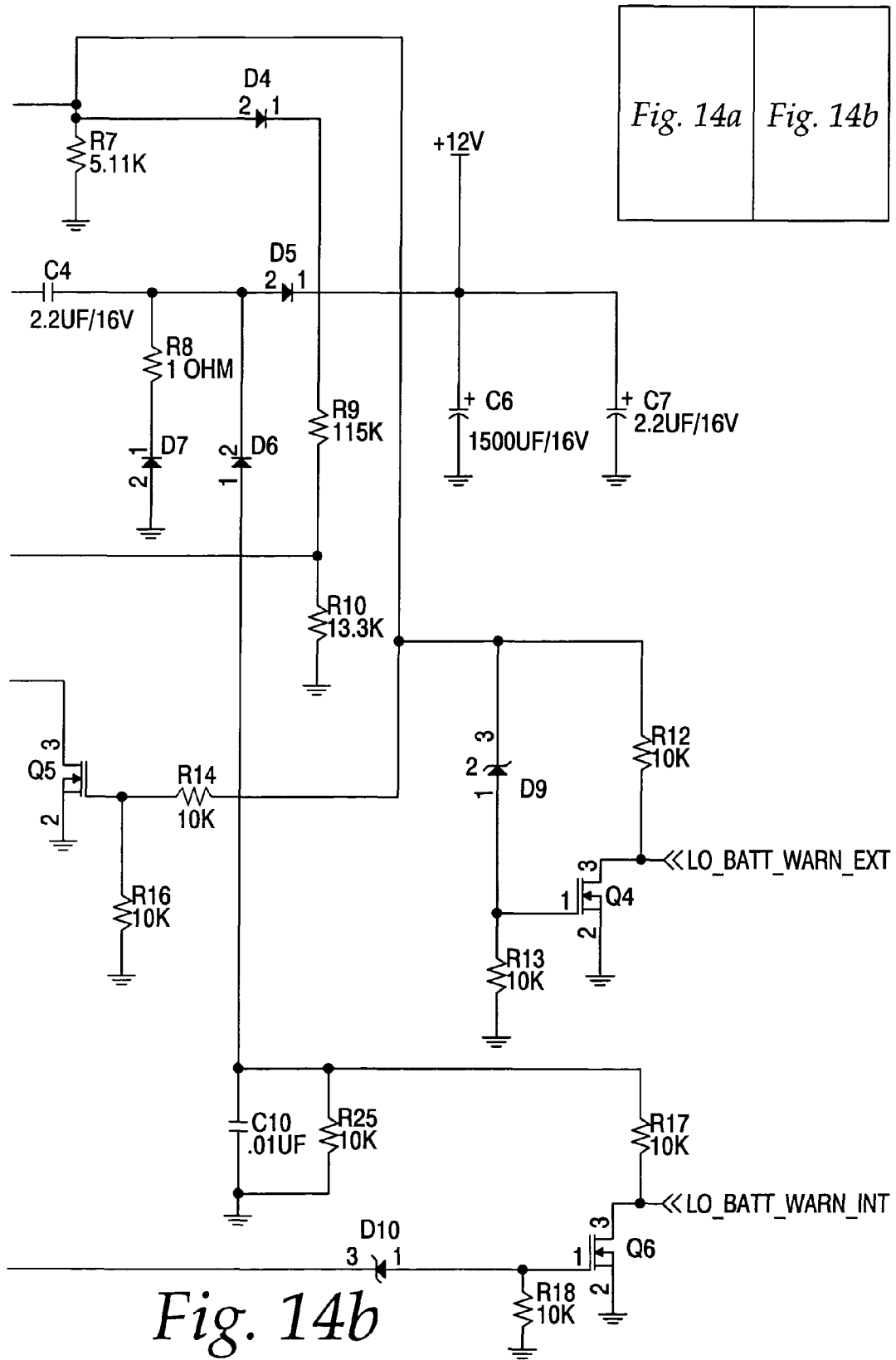

FIG. 4 is a block diagram illustrating the power supply for the transmitter unit. Batteries 38 power an indicator 40 that tells the user power is on. A low battery circuit 42 tests the battery voltage. If it is low an indicator 44 advises the user that battery power is low. Details of the power circuits are shown in FIGS. 9, 10 and 14a, 14b. The transmitter will be powered by an internal battery source BT1, BT2, BT3, and BT4 (FIG. 10). FIG. 14 illustrates the power monitoring circuitry 42 for the transmitter. Internal battery power, VBatt, is supplied by BT1, BT2, BT3, and BT4 in FIG. 10 through F1 and D8. U5B is unused. The DC-DC converter, U4, converts VBatt to 12 VDC through the circuit comprising C5, C8, L1, U4, C4, R9, R10, R8, D7, D5, C6, and C7. U5A enables U4 through R11 when an internal battery source is applied. When U4 is enabled, a signal through pin 5 of J10 activates the "Power On" LED circuit through pin 5 J1 in FIG. 12. The LED circuit comprises Q4, D3, and R3. R3 limits current to the LED, D3 that indicates to the user that the transmitter is on. Referring back to FIG. 14, components C10, R25, D6, D10, R17, R18, and Q6 generate signal Lo_Batt_Warn_Int if internal voltage drops below a voltage of 4 volts. If Lo_Batt_Warn_Int is present, the signal is applied to pin 3 of J10 which connects to pin 3 of J1 in FIG. 12. Lo_Batt_Warn_Int enables the circuit comprising Q2, D2, R2 to turn on the "Low Batt" LED, D2.

Figure 5:
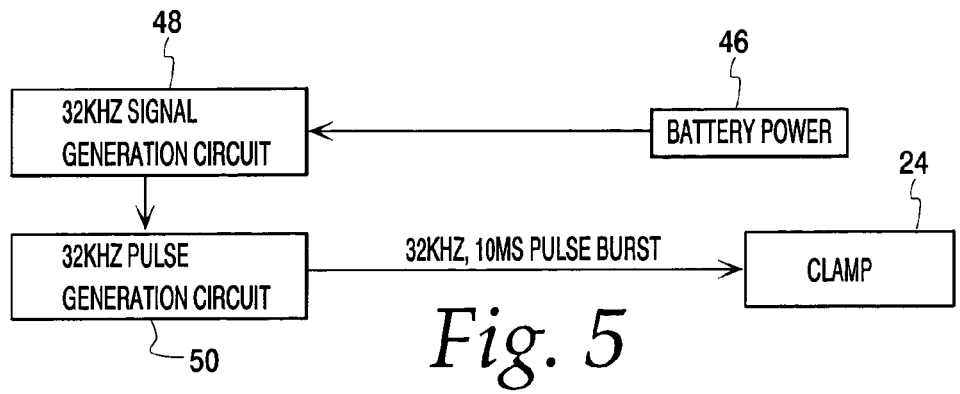
FIG. 5 is a block diagram of the alternate embodiment of the transmitter unit with an indirect clamp interface.

FIG. 5 describes the alternate clamp type transmitter 22. As mentioned above, this version of the transmitter can be used completely independently of the transmitter 10. Generally, the clamp type transmitter includes battery power 46 connected to a 32 KHz signal generation circuit 48. A pulse generation circuit 50 converts the continuous 32 KHz signal of circuit 48 to a pulsed 32 KHz signal. The pulses are supplied to the clamp 24.

Figure 15A:
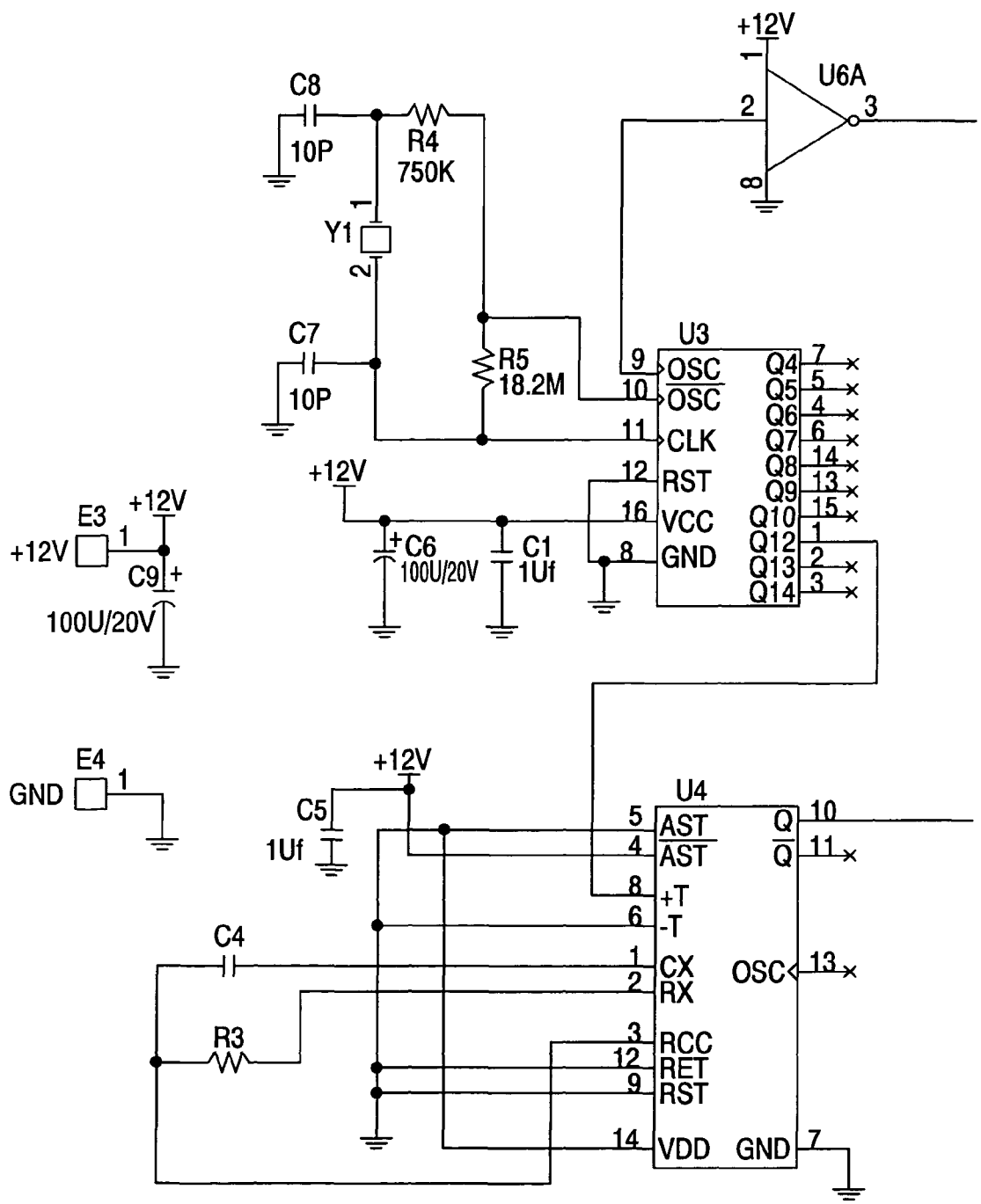
FIGS. 15a and 15b combine to form a circuit diagram of an alternate embodiment, namely the clamp version of the transmitter. The two Figures combine as illustrated in the lower right corner of FIG. 15a to form a single circuit; they are divided onto separate sheets only due to size limitations. The Figures may be referred to collectively as FIG. 15.
Figure 15B:
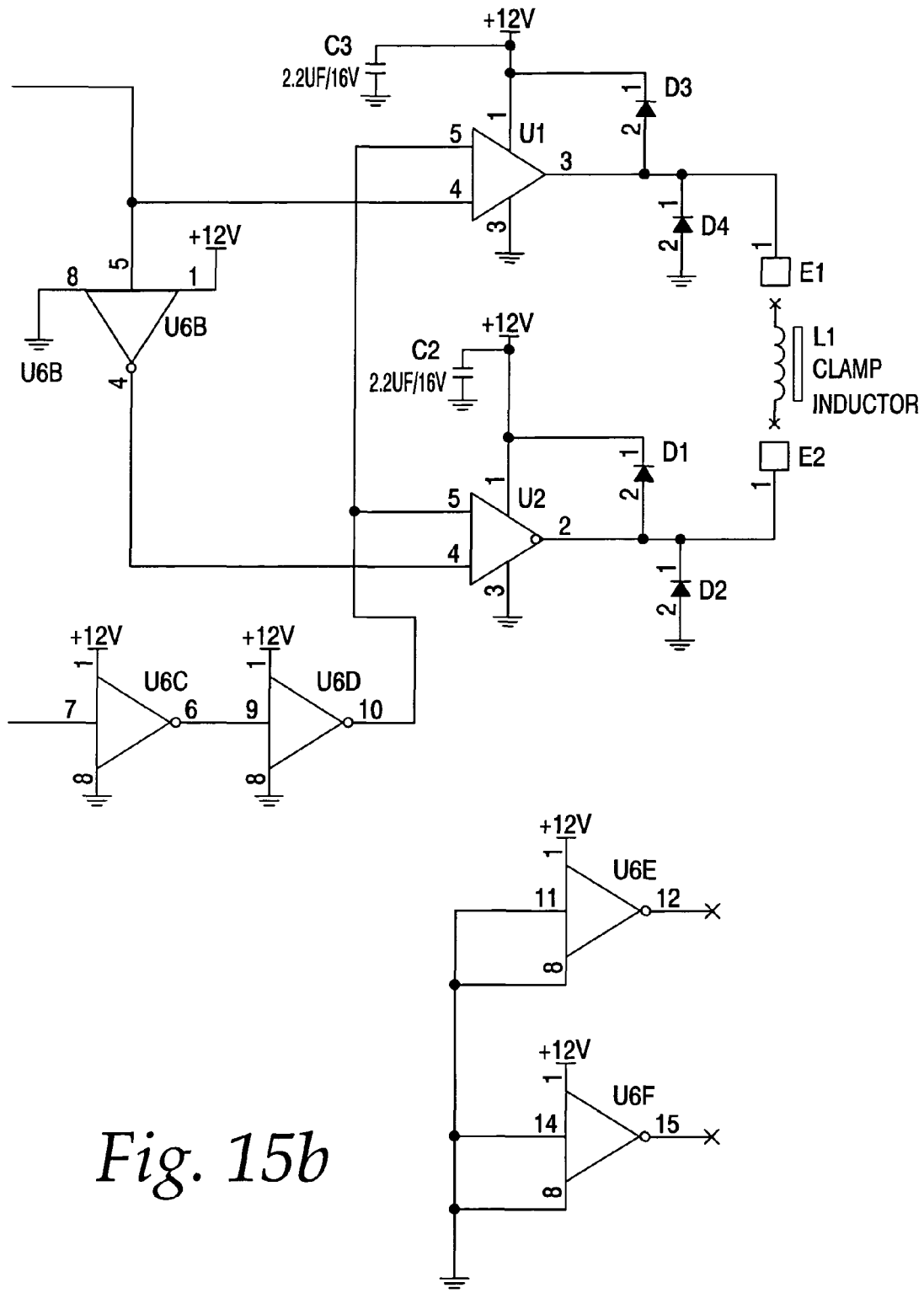

Details of these circuit elements are shown in FIG. 15. Components C1 and C6 (FIG. 15a) filter power to U3. C7, C8, Y1, R4, R5, and U3 provide a 32 KHz frequency. This signal is input through inverters U6A and U6B to operational amplifiers U1 and U2. U3 also connects to U4. C5, C4, and R3 set a 10 ms burst on the one-shot, U4, which provides a 10 millisecond duration signal that is input to U1 and U2 through buffers U6C and U6D. The output of buffers U1 and U2 is a 32 KHz pulsed burst of 10 millisecond duration that is output through D1, D2, D3, D4, C2, and C3 to the clamp inductor and repeated every 125 milliseconds. The signal is connected to the clamp core winding L1 through connectors E1 and E2. U6E and U6F are not used. Power is supplied to the clamp by an external battery pack via connectors E3 and E4.

Figure 6:
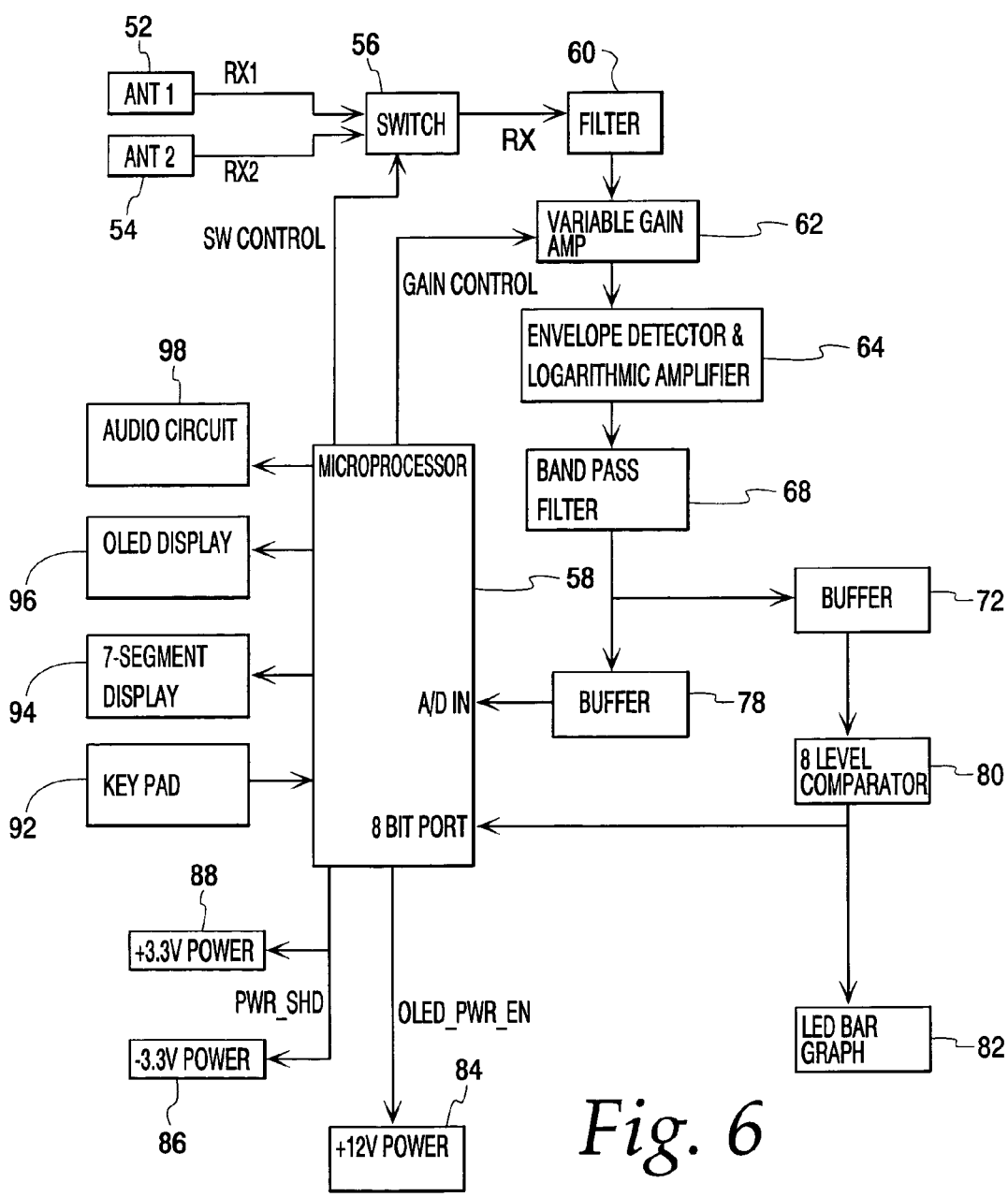
FIG. 6 is a block diagram of the receiver, illustrating the signal flow for the received signal as the receiver processes it.

The receiver 20 is described generally in FIG. 6. It includes first and second antennas 52 and 54 that detect the signal imposed on the wires by the transmitter. The antennas are connected to a switch 56. The switch is controlled by a microprocessor 58 to select the antenna most appropriate from keypad commands 92. Switch 56 sends the signal from the selected antenna to a filter 60. A variable gain amplifier 62 is controlled by the microprocessor 58 and provides a means to boost or attenuate the signal as needed. The output is fed to an envelope detector and logarithmic amplifier 64 that convert the 32 KHz 10 or 20 millisecond burst signal into a single 10 or 20 millisecond pulse. The filtered signal is then buffered at 78 before being sent to the A/D converter that resides in microprocessor 58 where it is processed for display 96. In addition, the filter signal from band pass filter 68 is buffered at 72 before which then drives an eight-level comparator 80. The output of the comparator is then fed to an eight-level LED bar graph 82 and an 8-bit input port to the microprocessor 58.

The microprocessor is supplied by suitable power circuits 84, 86 and 88. It may also connect to one or both of an OLED display 96 or a 7-segment display 94 (typically only one of these displays will be provided). An audio circuit 98 is also preferably connected to the microprocessor to provide an audible indication of the receiver signal strength and therefore an indication of how close the receiver is to the wire being traced.

Figure 16A:
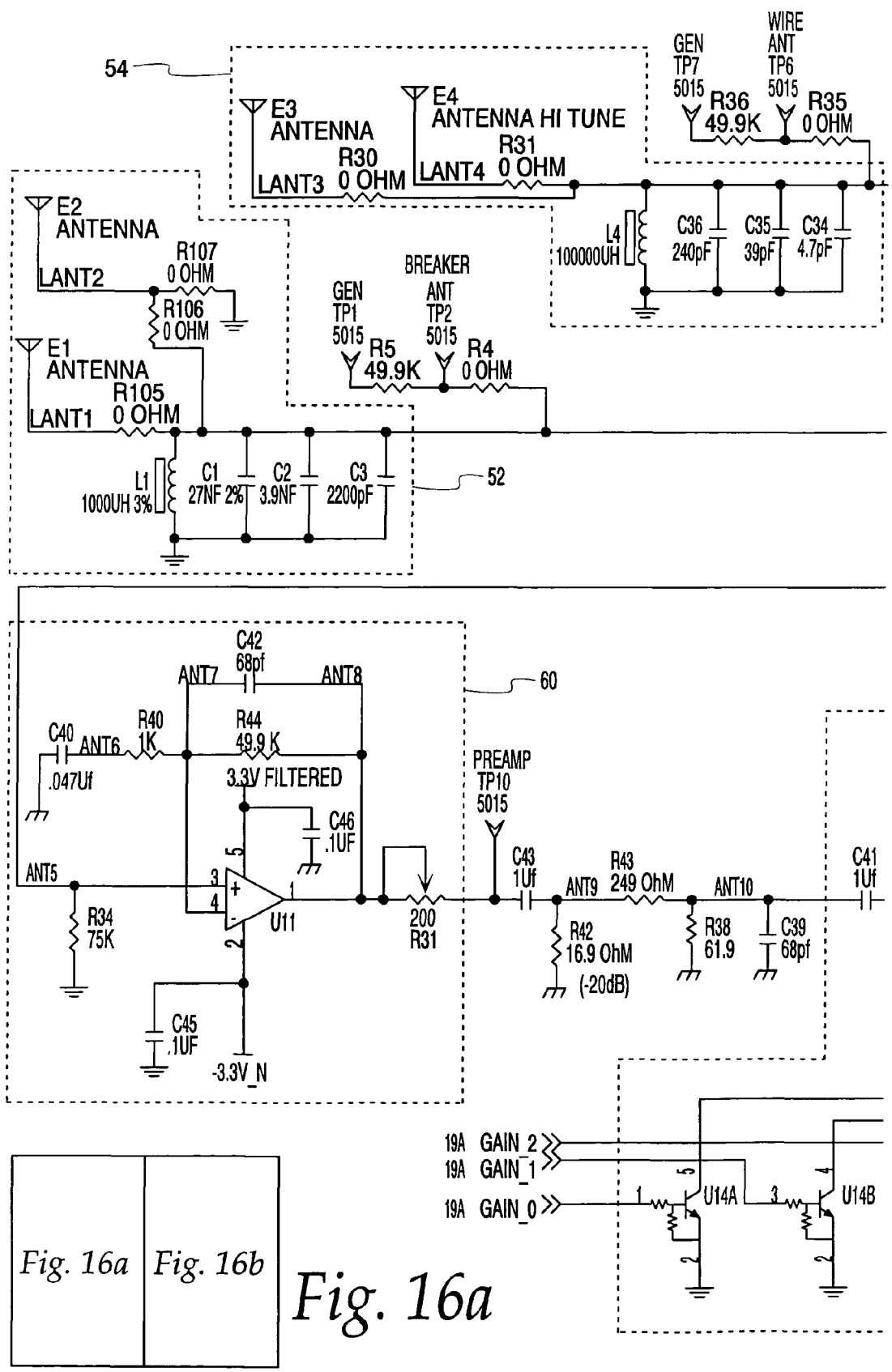

Details of the receiver will now be described beginning with reference to FIG. 16. E1, E2, L1, C1, C2 and C3 and R105, R106, R107 comprise the first antenna 52. E1 and E2 may be layers or planes of conductors formed in a PC board. Antenna 52 is connected to switch 56 via R104. E3, E4, L4, C36, C35 and C34 and R30, R31 comprise the second antenna 54. E3 and E4 may be layers or planes of conductors formed in a PC board. Antenna 54 is connected to switch 56 via R103. The inductors L1 and L4 do a good job of sensing the magnetic field of a powered circuit. When the circuit is not powered, the antenna layers or planes E1, E2, E3 and E4 are better at picking up the transmitter signal. U10 is the switch 56 which is controlled by the microprocessor 58 that selects the appropriate antenna. The received signal, on pin 6 of U10, is buffered by the filter circuit 60 comprising op-amp U11, C40, R40, R39, C45, C42, R44 and R41. After buffering, the signal is attenuated by the circuit comprised of C43, R42, R43 and R38. The receiver signal is then coupled to variable gain amplifier circuit 62 comprising U12, C41, U14A, U14B, U15A, R47, R48, R52 and C50. The microprocessor chooses one of three settings for the amplifier 62 by inputting a signal on Gain_0, Gain_1, and Gain_2. The circuit comprised of R56, R58, R57, C67, C63 and R63 further attenuates the output of the amplifier 62.

Figure 17A:
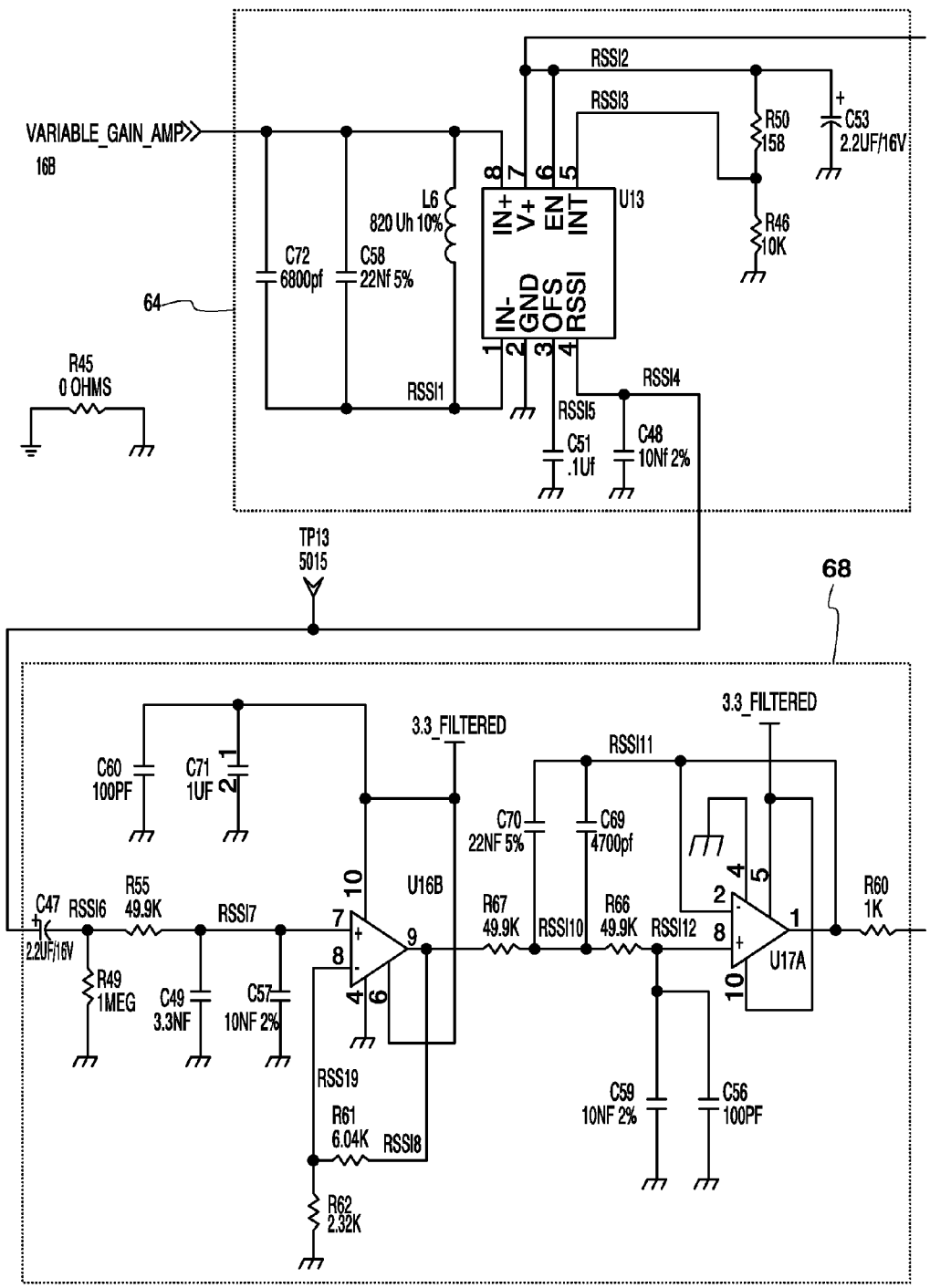
FIG. 17 is a circuit diagram of the RSSI and LP filter sections of the receiver circuit. The two Figures combine as illustrated to form a single circuit; they are divided onto separate sheets only due to size limitations. The Figures may be referred to collectively as FIG. 17.
Figure 19A:
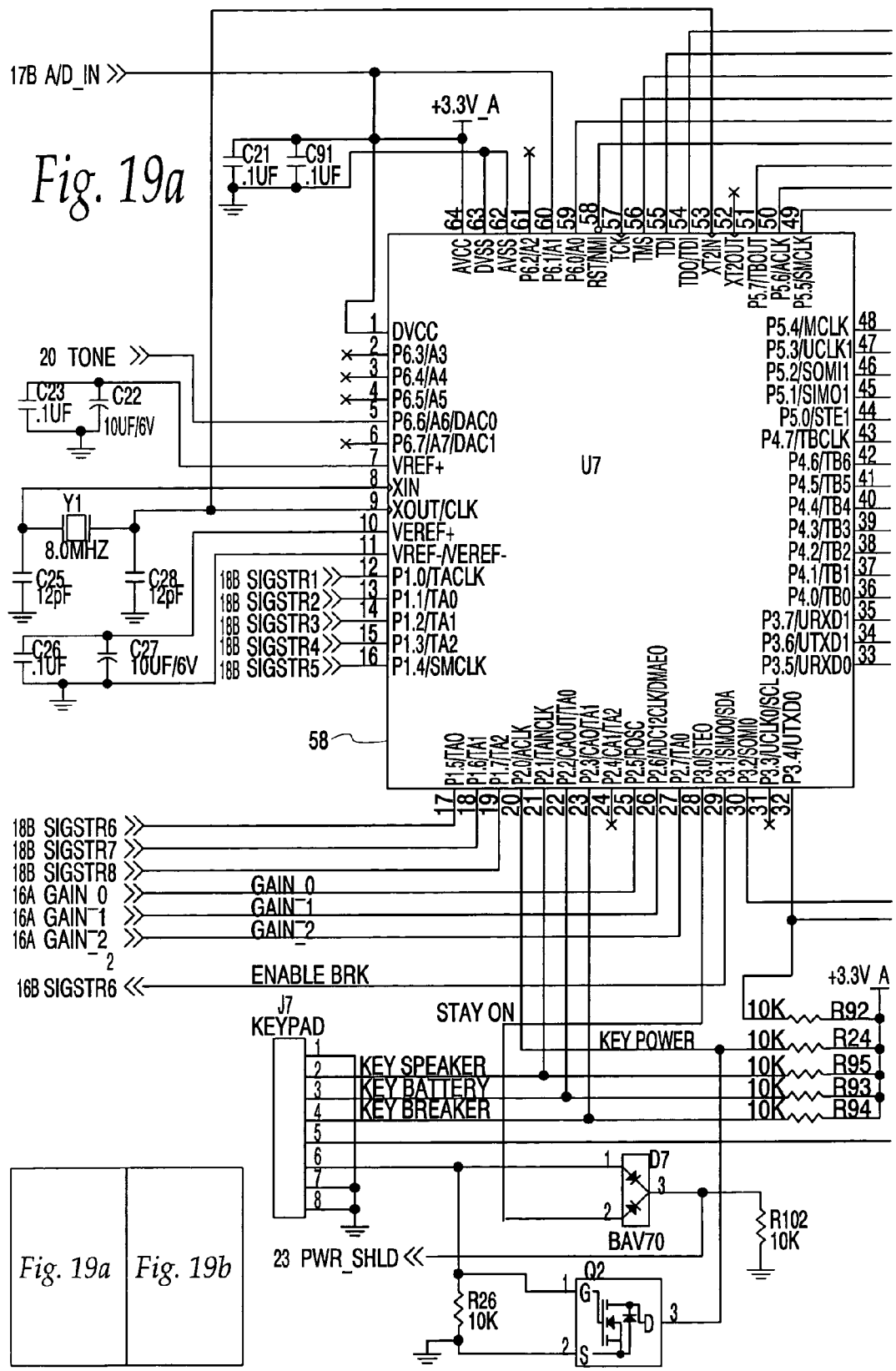
FIG. 19 is a circuit diagram of the microprocessor and display sections of the receiver circuit. The two Figures combine as illustrated to form a single circuit; they are divided onto separate sheets only due to size limitations. The Figures may be referred to collectively as FIG. 19.
Figure 19B:
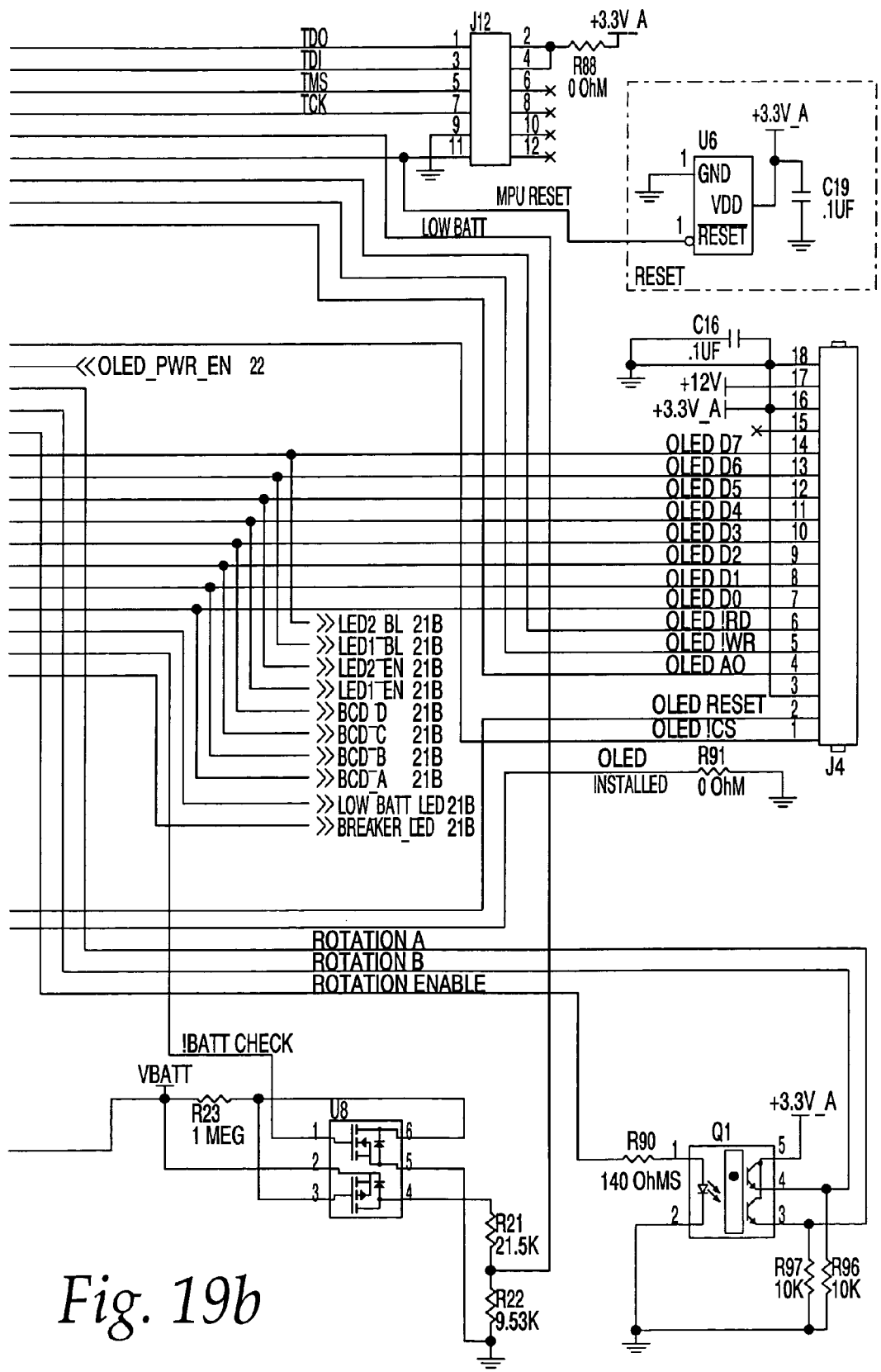

Looking now at FIG. 17, Variable_Gain_Amp is fed into an envelope detector/logarithmic amplifier circuit 64 comprising U13, C72, C58, L6, R50, R46, C53, C52 and C48. This circuit converts the received 32 KHz burst pulse to an analog signal ready for conversion to a digital signal by the microprocessor. A band pass filter 68 comprised of U17A, U17B, C47, R49, R55, C49, C57, R62, R61, R67, C70, C69, R66, C59, C56, and R60 filters the output of the logarithmic amplifier. The output of filter 68 drives buffers 72 and 78. The output to the buffer 72 is the signal strength and is labeled Sigstr_In. Buffer 78 comprised of components U16A, C66, R64, R59, R65, C90, R98, C65, C55 and C61 drives the A to D input of microprocessor 58 via the A/D_In output in FIG. 17b to analog to digital converter input in FIG. 19. An analog to digital converter is built into the microprocessor.

Figure 18A:
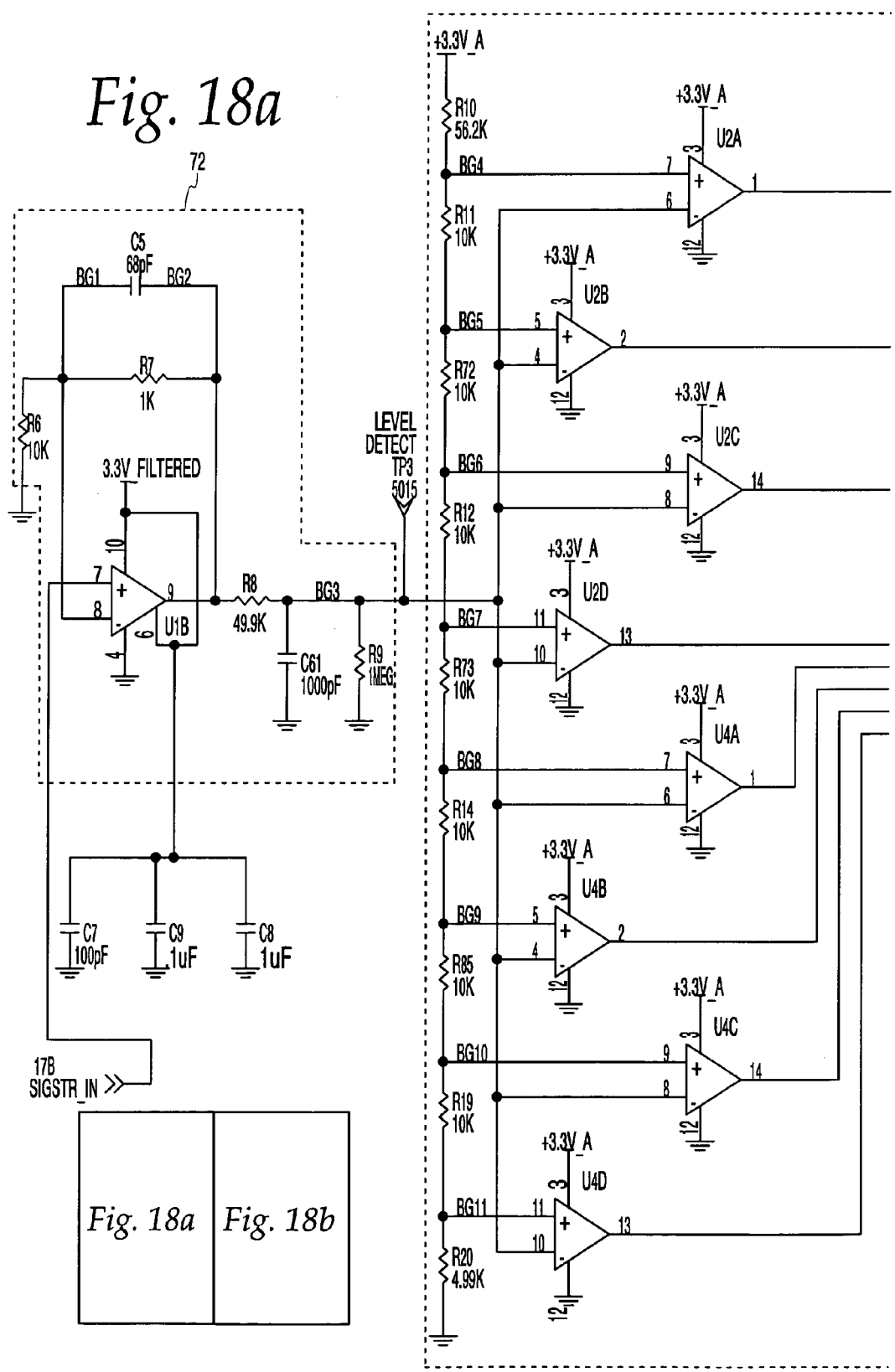
FIG. 18 is a circuit diagram of the signal strength indicator and LED bar graph sections of the receiver circuit. The two Figures combine as illustrated to form a single circuit; they are divided onto separate sheets only due to size limitations. The Figures may be referred to collectively as FIG. 18.

Turning now to FIG. 18, the receiver signal strength indicator signal Sigstr_In located after the band pass filter 68 drives buffer 72 comprising U1B, C5, R6, R7, R8, C6, and R9 and then to an eight level comparator circuit 80 comprising U2, U4, R10, R11, R72, R12, R13, R14, R85, R19, R20, R68, R70, R73, R75, R77, R80, R83, and R86. The output of these comparators illuminates an LED bar graph 82 comprising D1A, and the outputs are also connected to the microprocessor on lines Sigstr1 through Sigstr8. The 3.3V power is filtered by C10, C12 and C14.

Figure 20:
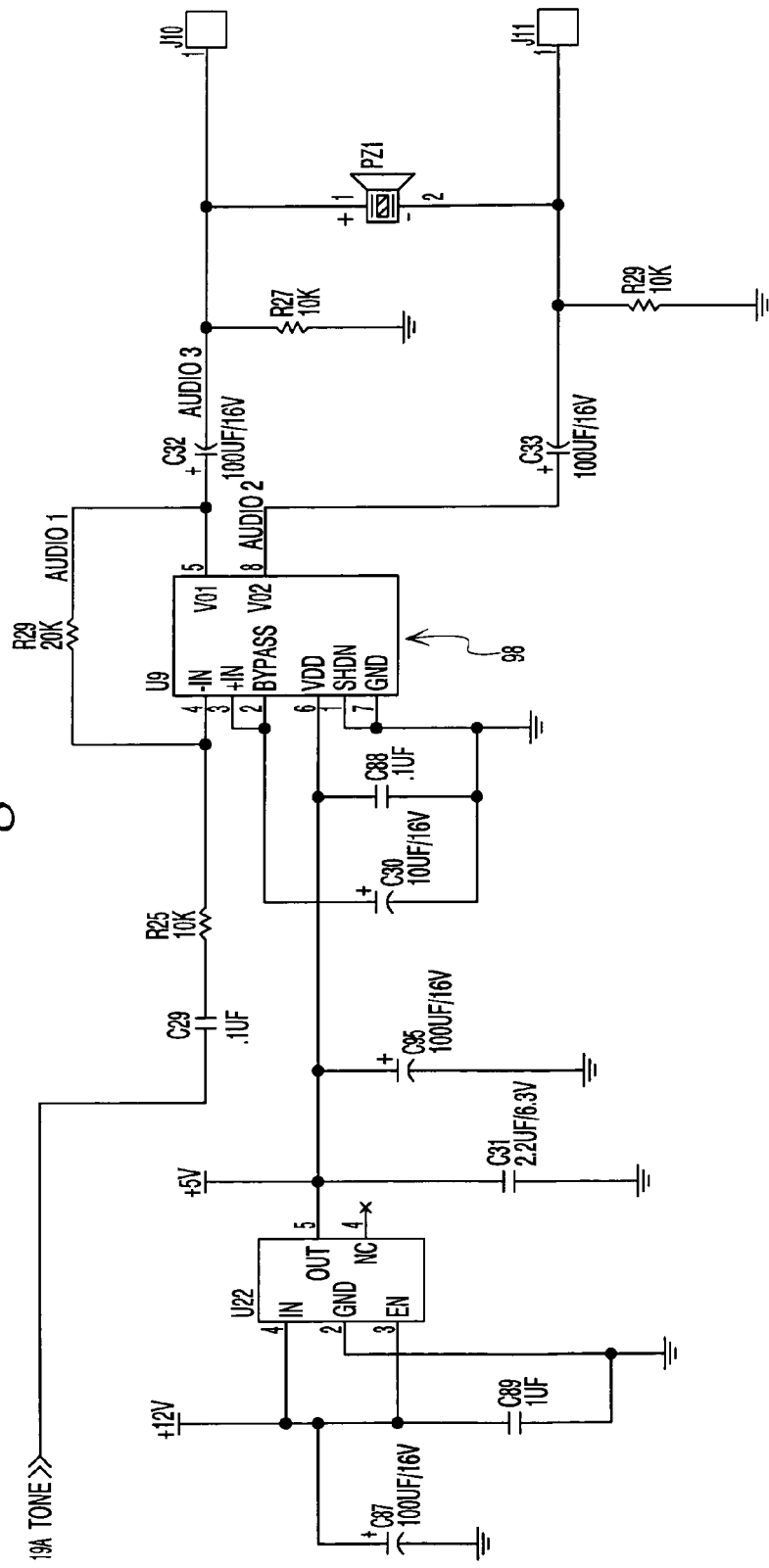
FIG. 20 is a circuit diagram of the audio section of the receiver circuit.

The microprocessor outputs a signal, Tone, to an audio circuit 98 comprising U9, C87, C89, U22, C31, C95, C29, R25, R28, C30, C88, C32 C33, R27, R29 and PZ1 in FIG. 20 that produces a beeping tone. The stronger the signal from the antennas the faster it beeps. Thus, the closer the receiver is to the wire being traced, the faster the beeping is.

Figure 21:
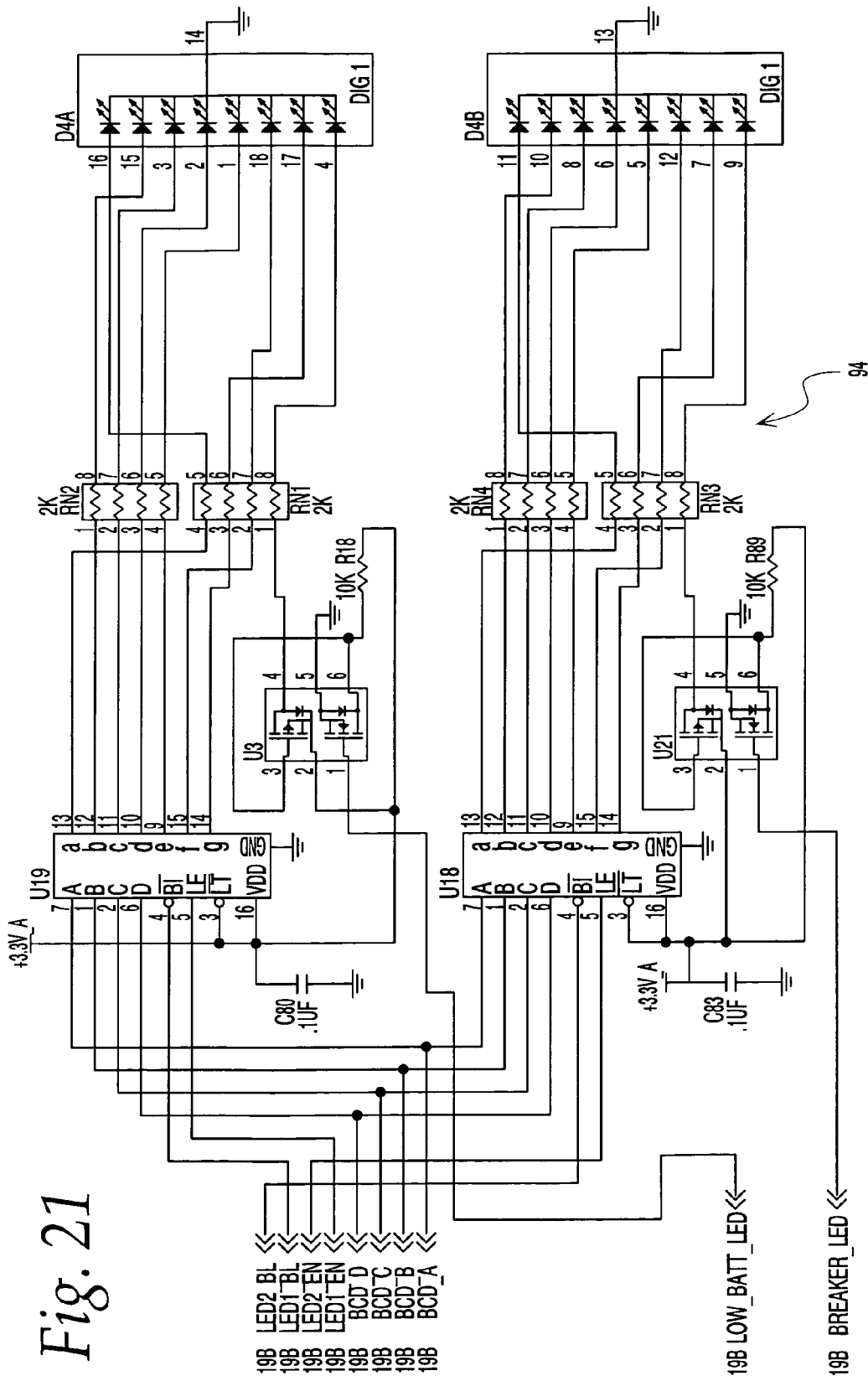
FIG. 21 is a circuit diagram of the 7-segment display section of the receiver circuit.

The microprocessor also outputs to the OLED display in one embodiment of the invention. Alternatively, it may output to the 7-segment display. The connection from the microprocessor 58 to the OLED display 96 is done through J4 shown in FIG. 19b. The circuitry comprising of components R90, Q1, R96 and R97 detects the physical orientation of the receiver. When used in conjunction with the OLED display this circuitry allows microprocessor to determine the orientation of the receiver and flip the image on the OLED display in one of four 90-degree orientations so that the signal strength value is always displayed right side up. The alternative 7-segment display circuit is shown in FIG. 21 comprising U19, U18, C80, C83, U21, U3, R89, R18, RN1, RN2, RN3, RN4, D4A and D4B. Both the OLED and 7-segment receive input from the microprocessor on pins 36-43 U7, which is microprocessor 58 in FIG. 19. In addition, the 7-segment display also receives input on pins 33-35. Pins 44-46 connect from U7 via connector J4 to only the OLED.

Figure 22:
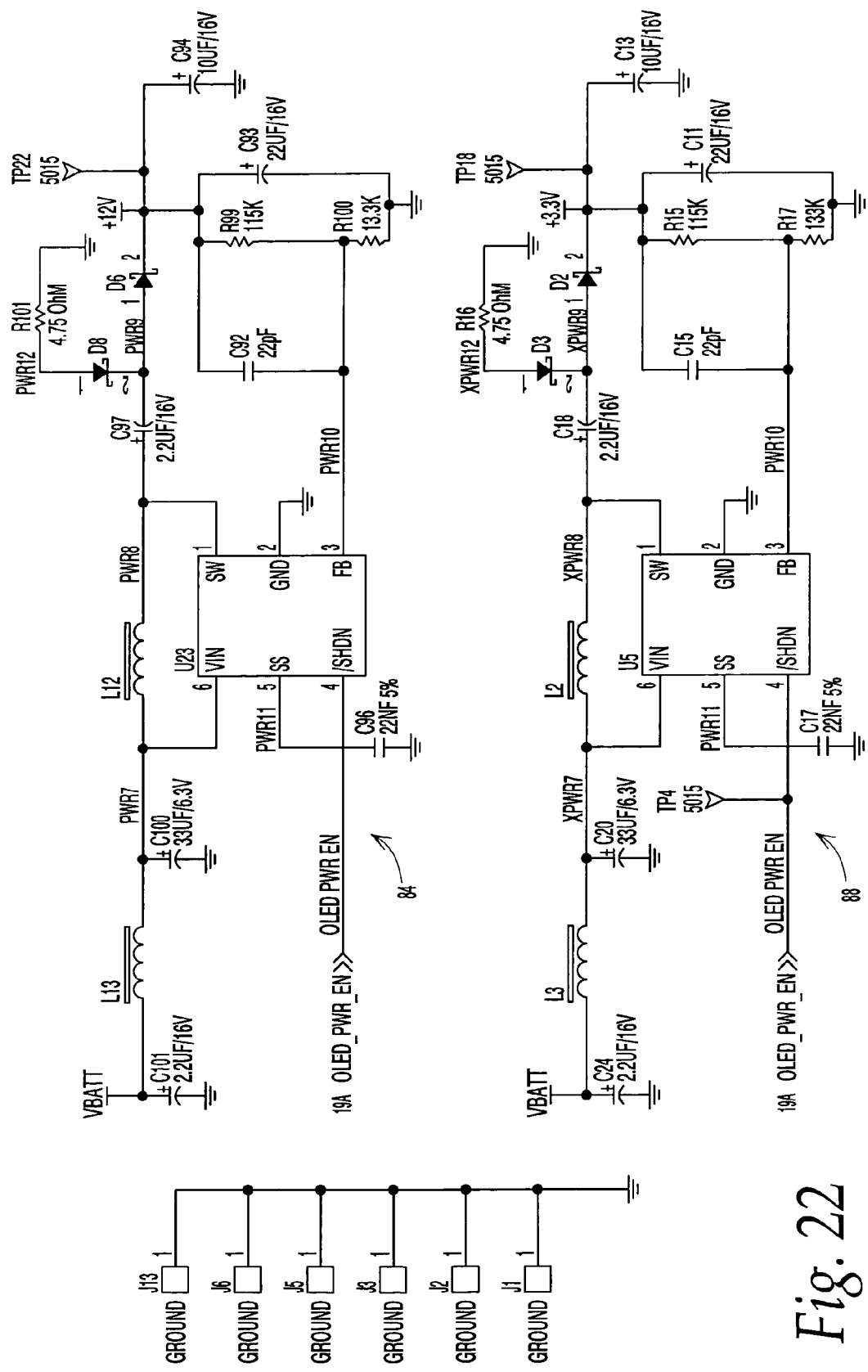
FIG. 22 is a circuit diagram of the 12V and 3.3V power supply sections of the receiver circuit.

FIG. 22 describes the 3.3V power supply derived from batteries AA1, AA2, and AA3. These 1.5V batteries provide power to the DC-DC regulators that produce the 3.3V and 12V power supplies 88 and 84. The 12V supply is only installed in models that use the OLED display.

Figure 23:
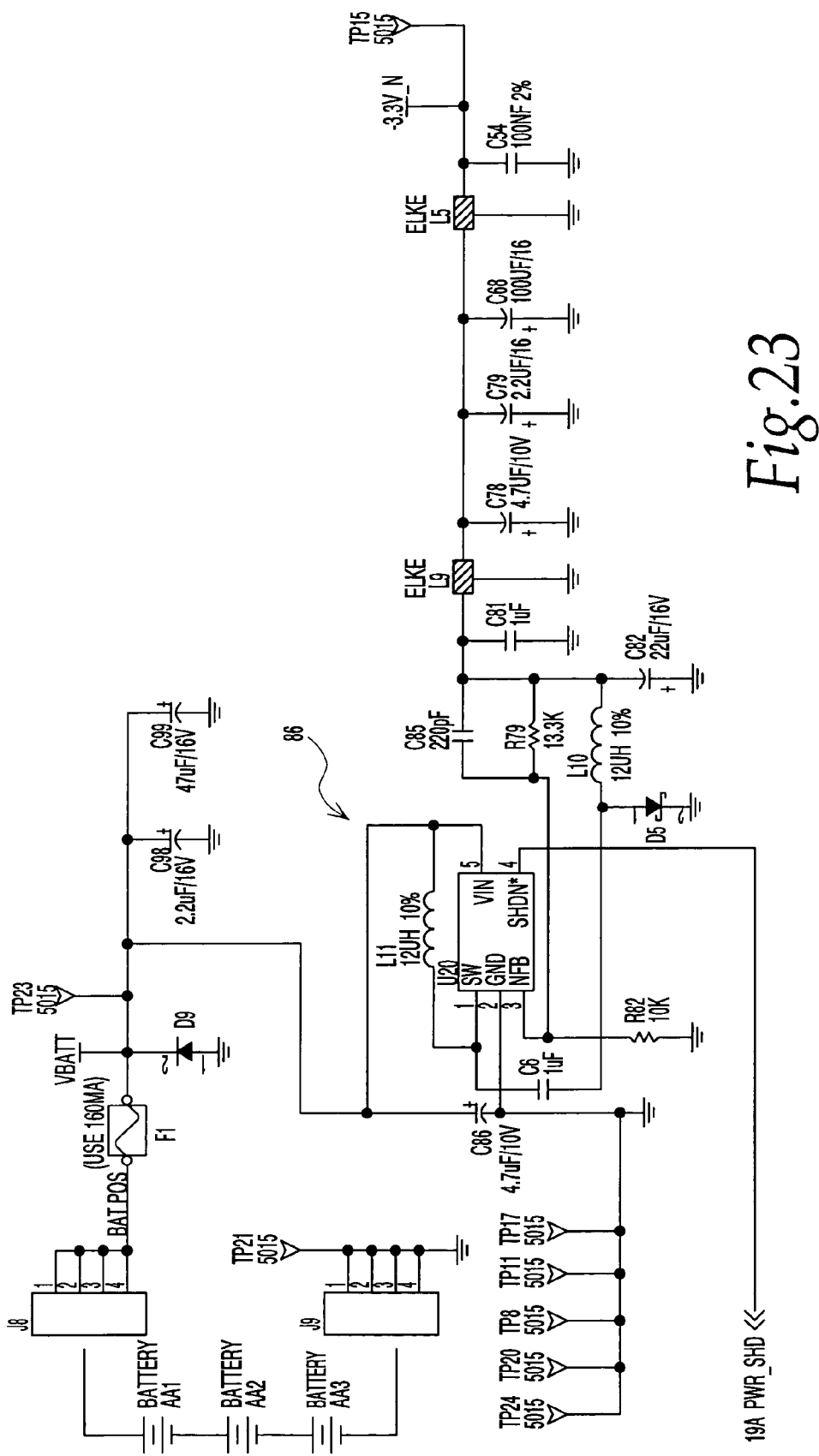
FIG. 23 is a circuit diagram of the −3.3V power supply section of the receiver circuit.

FIG. 23 describes the −3.3V power supply derived from batteries AA1, AA2, and AA3.

The operation of the receiver may be described generally as follows. The antennas 52, 54 respond to the 32 KHz burst imposed on the circuit by the transmitter. The receiver has multiple, selectable gain stages because the signal gets stronger or weaker depending on how far away the receiver is from the wire of the circuit being traced. The detected signal is converted into a square wave whose width is either 10 or 20 milliseconds, depending on which signal was sent by the transmitter. The magnitude of the converted square wave is fed into an analog-to-digital converter. The microprocessor displays that magnitude in one or more of a digital readout (providing a number indicative of relative signal strength), a 7-segment display, OLED display and bar graph.

The user through the use of the keypad commands the microprocessor to control the gain of the amplifier settings to either boost the signal or cut it down, depending on the incoming signal strength. If the signal is high (because the receiver is right on top of the wire) the gain is cut. If the signal is weak (because the receiver is farther away from the wire) the gain is increased. The microprocessor further measures the pulse width to determine whether to indicate the presence or absence of AC power. This indication may be provided on the digital readout, together with the signal strength number. The display may be oriented as needed to maintain it in a readable position despite turning or tilting of the receiver housing.

Implementation of the system disclosed herein enables a user to determine the location of an electric circuit comprised of wires. This invention incorporates at least four improvements over the prior art. It enhances safety, increases the number of useful applications, augments usability, and improves accuracy. First, safety is improved because the invention detects the presence of AC power on the circuit. When the transmitter unit is connected directly to the power outlet, it determines if AC power is present. If power is present, then a light emitting diode (LED), visible to the user, is illuminated on the transmitter unit. In addition, the signal transmitted on the electric circuit to the receiver unit varies depending on whether power is present or not. Being alerted to the presence of power increases safety because the user can verify that the circuit has been de-energized prior to any maintenance activities. For example, if the user opens a circuit breaker connected to the electric circuit being maintained, the circuit is de-energized and the transmitter of the present invention will change the signal it is imposing on the circuit. The receiver will detect the changed signal and indicate to the user that the signal has changed, thereby verifying that the circuit is the de-energized. However, if the circuit is powered because the wrong circuit breaker has mistakenly been opened, then this invention will alert the user by indicating AC or DC power is still present on the circuit because the transmitter signal did not change. Prior art tracers provide no indication of the presence or absence of power and thus a potential safety hazard exists.

Second, this invention increases the number of applications available for the circuit tracer because the clamp operates independently of the transmitter unit. In the prior art, the clamp was merely an accessory that required a connection to the transmitter unit. In the present invention, the clamp has its own transmitter circuitry, allowing it to operate independently of the regular transmitter so that a relatively bulky transmitter unit is not needed for operation. Thus, a clamp can be positioned in an area of limited space, which not only improves upon the number of potential applications for the circuit tracer but also improves ease of use for the user. Also, it is possible for the user to be able to check multiple lines by using both the clamp apparatus and transmitter unit at the same time. Thus, this improves efficiency and provides a more economical alternative than the prior art.

In addition to the transmitter, in one embodiment of the invention the receiver also improves upon ease of use by providing a rotating viewing display. The display, which indicates the signal strength and thus location of the wire being traced, detects when the receiver's orientation changes and compensates by rotating the image on the display. In other words, if the receiver is turned 180 degrees (or upside-down), then the display will also rotate the image 180 degrees so that the user is presented with the most convenient orientation for viewing. This feature is useful while tracing wires of an electric circuit in a location that precludes re-orientation of the receiver without losing the location of the wire being traced. Rotation improves readability that improves efficiency for the user because less time will be needed to read the display correctly. Also, mistakes will be lessened since the user will not have as much difficulty reading the display.

Finally, accuracy of the receiver is improved through the use of multiple antennas within the receiver circuit. By using two antennas, the overall range of the receiver is increased. One antenna has high gain to receive low power signals. When the signal strength becomes too high, the user switches to the second antenna with lower gain so that the receiver circuit is not overloaded. By using a combination of antennas, the receiver has a greater effective range than prior art. This improves the user's efficiency by being able to locate the signal faster with the receiver. For example, in a situation where wires are present in a large area, the receiver using the high gain antenna will be able to detect the signal from further away than prior art and direct the user to the correct wire while automatically switching to the other antenna to avoid overloading the receiver when the wire is near. With only one antenna, the signal locating process takes more time. The user needs to bring the receiver closer to the wires and move around the area until a signal is detected.

Together, these improvements result in a more robust and useful circuit tracer than in the prior art. Although discussed in terms of electrical circuits, the embodiments disclosed herein are applicable to a wide range of applications including, for example, detecting the location of metal pipes and other type of wiring such as network and phone cables and wires. Also, while representative values for many of the circuit components are shown, it will be understood that these values could be other than as shown without departing from the scope of the following claims. Other modifications are possible as well. For example, the clamp version of the transmitter could include the power indicating feature wherein different trace signals are imposed on the circuit depending on whether power is present or not.

What is claimed is:

1. A receiver for a circuit tracer, comprising a housing, a display mounted in the housing for visually displaying information to a user, a sensor in the housing for detecting the orientation of the receiver as a whole, the display being responsive to the sensor to orient its information such that it is readable by a user and wherein the display is responsive to the sensor to rotate the information on the display in one of four 90-degree orientations so that the information is always displayed right side up.

2. The circuit tracer of claim 1 wherein the display is an OLED display.

3. The circuit tracer of claim 1 wherein the display is a seven-segment LED display.

4. The circuit tracer of claim 1 wherein the information comprises signal strength.

5. A receiver for a circuit tracer, comprising:

a housing;

a sensor in the housing for detecting the orientation of the receiver as a whole; a display mounted in the housing for visually displaying information, the display being responsive to the sensor to rotate the information on the display such that it is readable by a user upon rotation of the receiver as a whole and wherein the display is responsive to the sensor to rotate the information on the display in one of four 90-degree orientations so that the information is always displayed right side up.

6. The circuit tracer of claim 5 wherein the display is an OLED display.

7. The circuit tracer of claim 5 wherein the display is a seven-segment LED display.

8. The circuit tracer of claim 5 wherein the information comprises signal strength.

\* \* \* \* \*